(12) United States Patent
Matioli et al.

(10) Patent No.: US 11,476,357 B2
(45) Date of Patent: Oct. 18, 2022

(54) SEMICONDUCTOR DEVICE COMPRISING A THREE-DIMENSIONAL FIELD PLATE

(71) Applicant: ECOLE POLYTECHNIQUE FEDERALE DE LAUSANNE (EPFL), Lausanne (CH)

(72) Inventors: Elison de Nazareth Matioli, Lausanne (CH); Jun Ma, Prilly (CH)

(73) Assignee: ECOLE POLYTECHNIQUE FEDERALE DE LAUSANNE (EPFL), Lausanne (CH)

( * ) Notice: Subject to any disclaimer, the term of this patent is extended or adjusted under 35 U.S.C. 154(b) by 0 days.

(21) Appl. No.: 16/337,668

(22) PCT Filed: Sep. 28, 2017

(86) PCT No.: PCT/IB2017/055961
§ 371 (c)(1),
(2) Date: Mar. 28, 2019

(87) PCT Pub. No.: WO2018/060918
PCT Pub. Date: Apr. 5, 2018

(65) Prior Publication Data
US 2019/0229208 A1    Jul. 25, 2019

Related U.S. Application Data

(60) Provisional application No. 62/400,643, filed on Sep. 28, 2016.

(51) Int. Cl.
*H01L 29/778* (2006.01)
*H01L 27/06* (2006.01)
(Continued)

(52) U.S. Cl.
CPC ........ *H01L 29/778* (2013.01); *H01L 27/0629* (2013.01); *H01L 29/0611* (2013.01);
(Continued)

(58) Field of Classification Search
CPC ............... H01L 29/778; H01L 29/0611; H01L 29/0657; H01L 29/205; H01L 29/402;
(Continued)

(56) References Cited

U.S. PATENT DOCUMENTS

2010/0140715 A1* 6/2010 Nakamura .......... H01L 29/0653
                                                        257/368
2011/0169103 A1   7/2011 Darwish et al.
(Continued)

FOREIGN PATENT DOCUMENTS

EP          1073123 A2    1/2001

OTHER PUBLICATIONS

Bahat-Treidel et al., "AlGaN/GaN HEMT With Integrated Recessed Schottky-Drain Protection Diode" *IEEE Electron Device Letters*, vol. 30, No. 9: 901-903 (Sep. 2009).
(Continued)

*Primary Examiner* — Christine A Enad
(74) *Attorney, Agent, or Firm* — Nixon & Vanderhye P.C.

(57) ABSTRACT

The present invention relates to a Semiconductor device including a first electrode, a second electrode and at least one semiconductor material or layer between the first and second electrode. The semiconductor device further includes at least one field plate structure for increasing a breakdown voltage of the semiconductor device. The at least one field plate structure comprises at least two recesses in the at least one semiconductor material or layer, the at least two recesses defining a semiconductor region therebetween, and a third electrode contacting or provided on the semiconductor region.

23 Claims, 30 Drawing Sheets

(51) Int. Cl.

| | |
|---|---|
| *H01L 29/06* | (2006.01) |
| *H01L 29/40* | (2006.01) |
| *H01L 29/66* | (2006.01) |
| *H01L 29/205* | (2006.01) |
| *H01L 29/872* | (2006.01) |
| *H01L 29/417* | (2006.01) |
| *H01L 29/423* | (2006.01) |
| H01L 29/808 | (2006.01) |
| H01L 29/20 | (2006.01) |

(52) U.S. Cl.
CPC ........ *H01L 29/0657* (2013.01); *H01L 29/205* (2013.01); *H01L 29/402* (2013.01); *H01L 29/404* (2013.01); *H01L 29/407* (2013.01); *H01L 29/41766* (2013.01); *H01L 29/4236* (2013.01); *H01L 29/66431* (2013.01); *H01L 29/7786* (2013.01); *H01L 29/8725* (2013.01); *H01L 29/2003* (2013.01); *H01L 29/808* (2013.01)

(58) Field of Classification Search
CPC ............... H01L 29/404; H01L 29/407; H01L 29/41766; H01L 29/4236; H01L 29/66431; H01L 29/7786; H01L 29/8725; H01L 27/0629
See application file for complete search history.

(56) References Cited

U.S. PATENT DOCUMENTS

| | | | | |
|---|---|---|---|---|
| 2013/0334573 | A1 | 12/2013 | Ostermaier et al. | |
| 2014/0070228 | A1* | 3/2014 | Palacios | H01L 29/407 257/76 |
| 2014/0284700 | A1* | 9/2014 | Nozu | H01L 29/407 257/328 |
| 2015/0137224 | A1 | 5/2015 | Meiser et al. | |
| 2016/0181413 | A1* | 6/2016 | Fujita | H01L 29/1095 257/329 |
| 2018/0026133 | A1* | 1/2018 | Meiser | H01L 29/0696 257/335 |
| 2020/0052077 | A1* | 2/2020 | Altstaetter | H01L 29/0696 |

OTHER PUBLICATIONS

Bahat-Treidel et al., "Fast-Switching GaN-Based Lateral Power Schottky Barrier Diodes With Low Onset Voltage and Strong Reverse Blocking" *IEEE Electron Device Letters*, vol. 33, No. 3: 357-359 (Mar. 2012).

Hu et al., "Performance Optimization of Au-Free Lateral AlGaN/GaN Schottky Barrier Diode With Gated Edge Termination on 200-mm Silicon Substrate" *IEEE Electron Device Letters*, vol. 63, No. 3: 997-1004 (Mar. 2016).

Ikeda et al., "High-power AlGaN/GaN MIS-HFETs with field-plates on Si substrates" *IEEE*, pp. 251-254 (2009).

Laboutin et al., "High-Power AlGaN/GaN Hetero structure Field-Effect Transistors on 200 mm Si Substrates" *ECS Transactions*, vol. 66, No. 1: 191-199 (2015).

Lee et al., "Low Turn-On Voltage AlGaN/GaN-on-Si Rectifier With Gated Ohmic Anode" *IEEE Electron Device Letters*, vol. 34, No. 2: 214-216 (Feb. 2013).

Lee et al., "AlGaN/GaN-Based Lateral-Type Schottky Barrier Diode With Very Low Reverse Recovery Charge at High Temperature" *IEEE Electron Device Letters*, vol. 60, No. 10: 3032-3039 (Oct. 2013).

Lee et al. "Unidirectional AlGaN/GaN-on-Si HFETs with reverse blocking drain" *Applied Physics Express*, vol. 7, 014101, 4 pages (2014).

Lian et al., "AlGaN/GaN HEMTs on Silicon With Hybrid Schottky-Ohmic Drain for High Breakdown Voltage and Low Leakage Current" *IEEE Electron Device Letters*, vol. 33, No. 7: 973-975 (Jul. 2012).

Lian et al., "AlGaN/GaN Schottky Barrier Diodes on Silicon Substrates With Selective Si Diffusion for Low Onset Voltage and High Reverse Blocking" *IEEE Electron Device Letters*, vol. 34, No. 8: 981-983 (Aug. 2013).

Ma et al., "Improved electrical and thermal performances in nanostructured GaN devices" *International Conference on IC Design and Technology (ICICDT)*, 4 pages (Jun. 2016).

Sheng-Lei et al., "Mechanism of improving forward and reverse blocking voltages in AlGaN/GaN HEMTs by using Schottky drain" *Chinese Physics B*, vol. 23, No. 10, 107303, 5 pages (2014).

Taube et al., "Temperature-dependent electrical characterization of high-voltage AlGaN/GaN-on-Si HEMTs with Schottky and ohmic drain contacts" *Solid-State Electronics*, vol. III: 12-17 (2015).

Tsou et al., "2.07-kV AlGaN/GaN Schottky Barrier Diodes on Silicon With High Baliga's Figure-of-Merit" *IEEE Electron Device Letters*, vol. 37, No. 1: 70-72 (Jan. 2016).

Zhou et al., "Schottky-Ohmic Drain AlGaN/GaN Normally Off HEMT With Reverse Drain Blocking Capability" *IEEE Electron Device Letters*, vol. 31, No. 7: 668-670 (Jul. 2010).

Zhou et al., "High Reverse Blocking and Low Onset Voltage AlGaN/GaN-on-Si Lateral Power Diode With MIS-Gated Hybrid Anode" *IEEE Electron Device Letters*, vol. 36, No. 7: 660-662 (Jul. 2015).

Zhu et al., "1.9-kV AlGaN/GaN Lateral Schottky Barrier Diodes on Silicon" *IEEE Electron Device Letters*, vol. 36, No. 4: 375-377 (Apr. 2015).

Bin Lu, et al., "Tri-Gate Normally-Off GaN Power MISFET", IEEE Electron Device Letters, IEEE Service Center, vol. 33, No. 3, Mar. 1, 2012, 4 pages.

Elison Matioli, et al., "Ultralow Leakage Current AlGaN/GaN Schottky Diodes With 3-D Anode Structure", IEEE Transactions on Electron Devices, IEEE Service Center, vol. 60, No. 10, Oct. 1, 2013, 6 pages.

Kota Ohi, et al., "Drain Current Stability and Controllability of Threshold Voltage and Subthreshold Current in a Multi-Mesa-Channel AlGaN/GaN High Electron Mobility Transistor", Japanese Journal of Applied Physics, vol. 48, No. 8, Aug. 1, 2009, 6 pages.

International Search Report for PCT/IB2017/055961 dated Mar. 13, 2018, 7 pages.

Written Opinion of the ISA for PCT/IB2017/055961 dated Mar. 13, 2018, 11 pages.

Communication pursuant to Article 94(3) EPC dated Apr. 6, 2020, issued in European Patent Application No. 17793728.1, 4 pages.

* cited by examiner

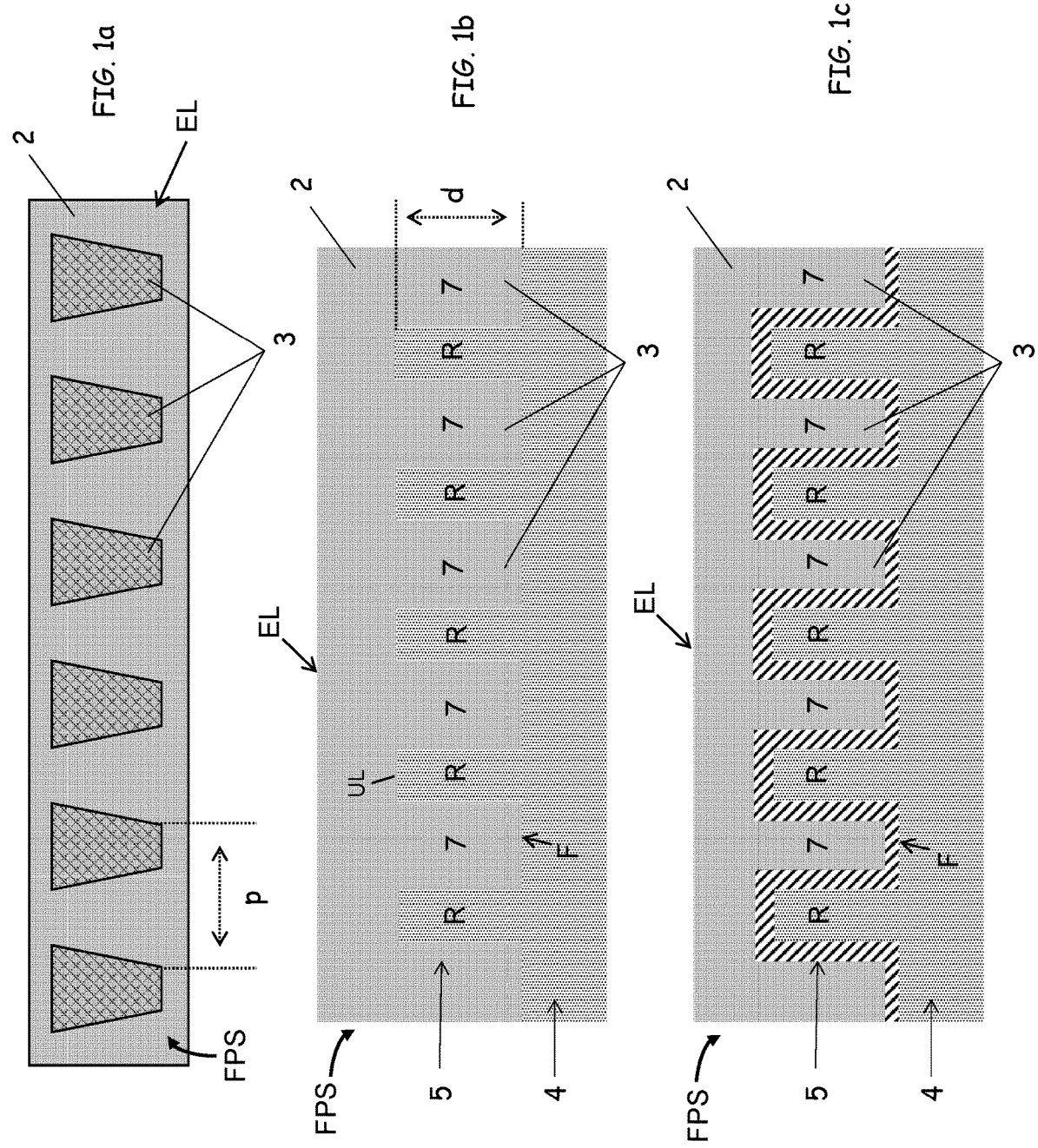

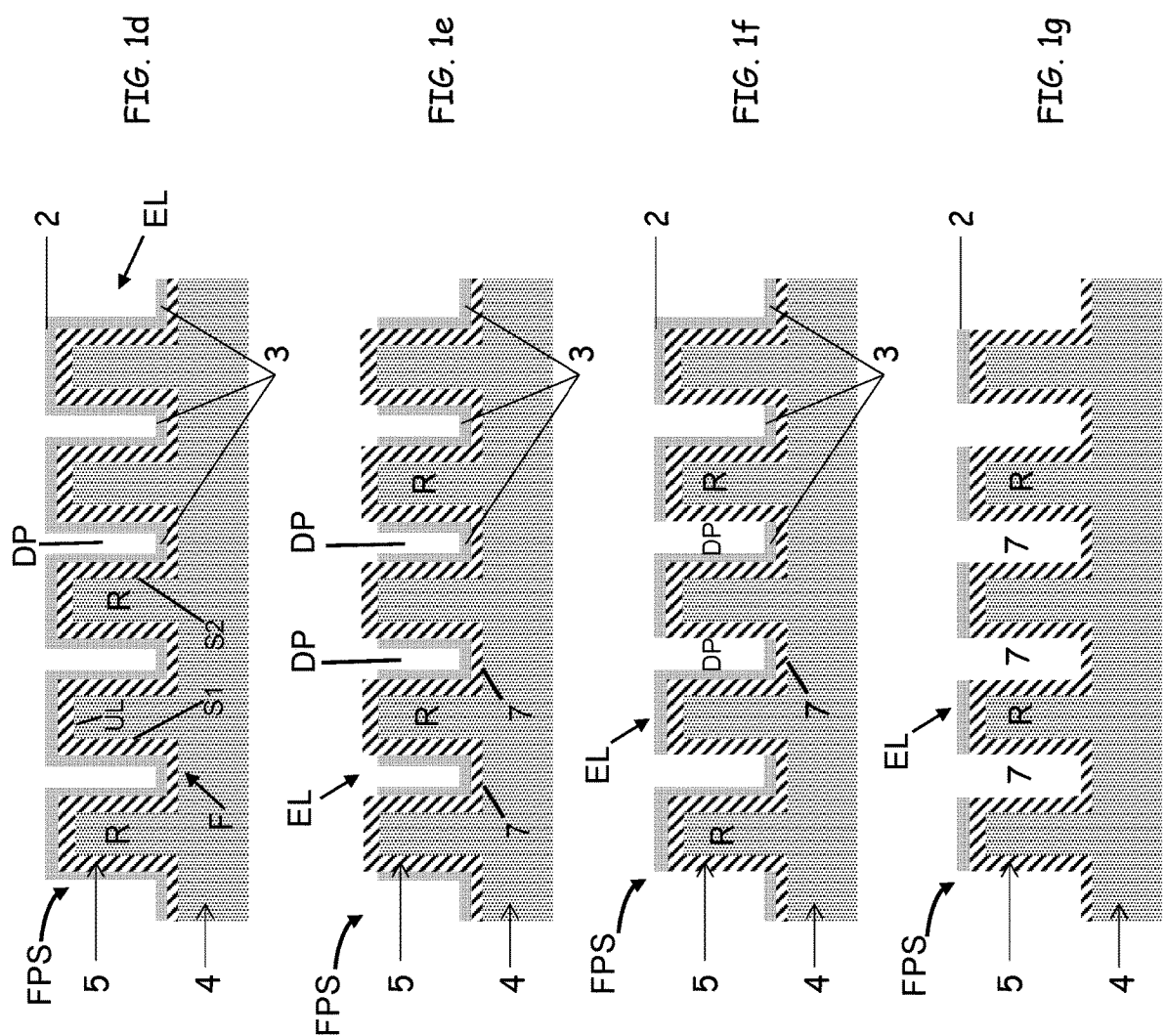

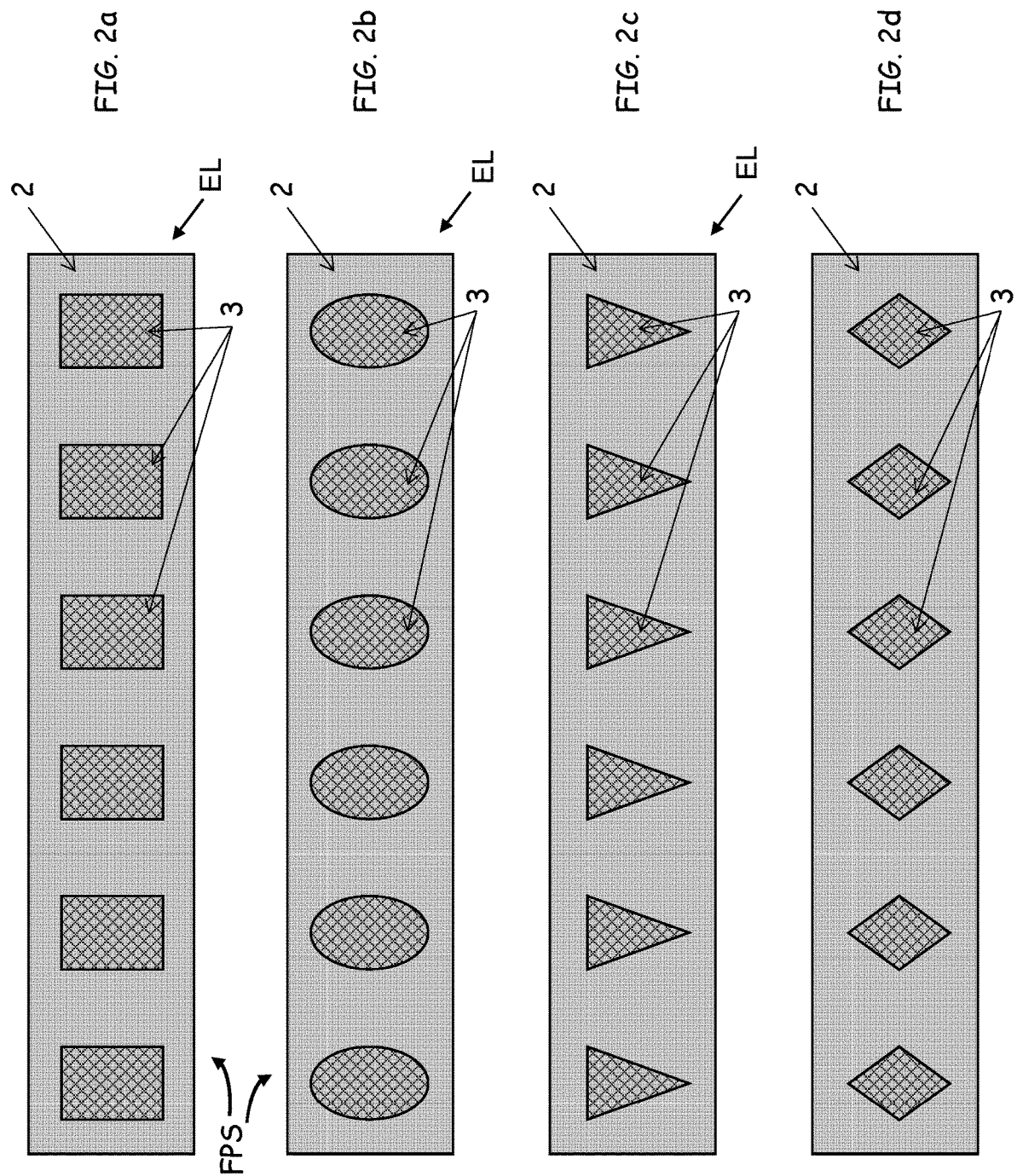

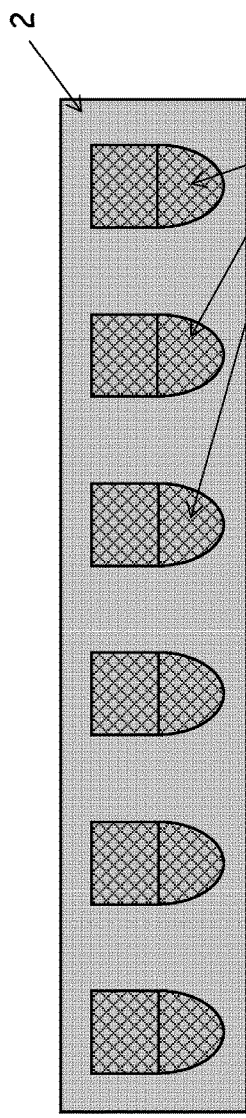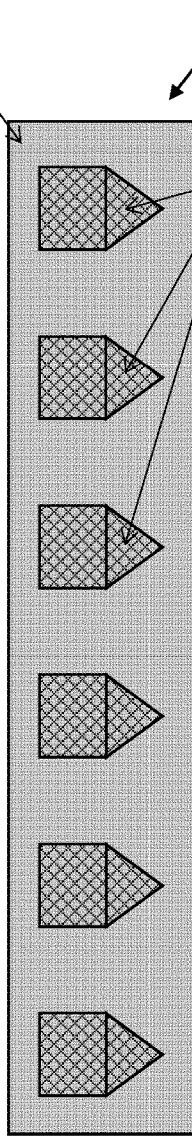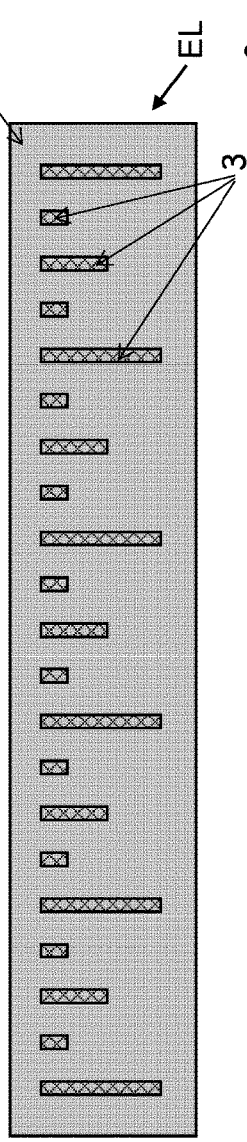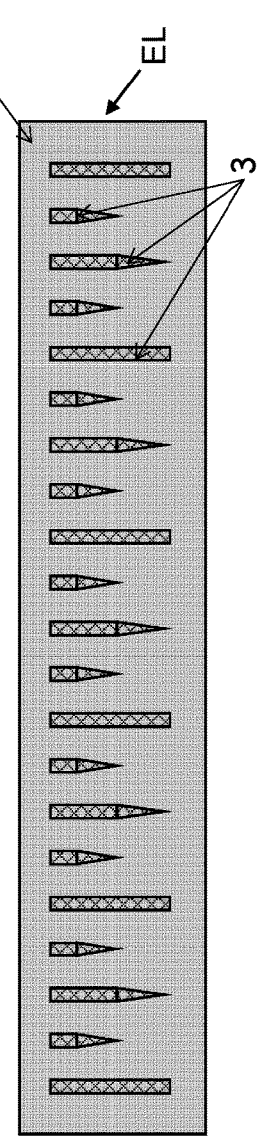

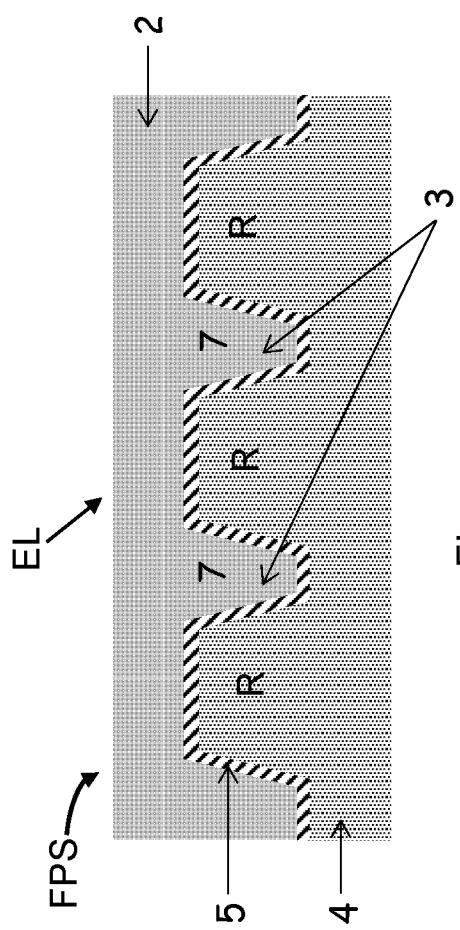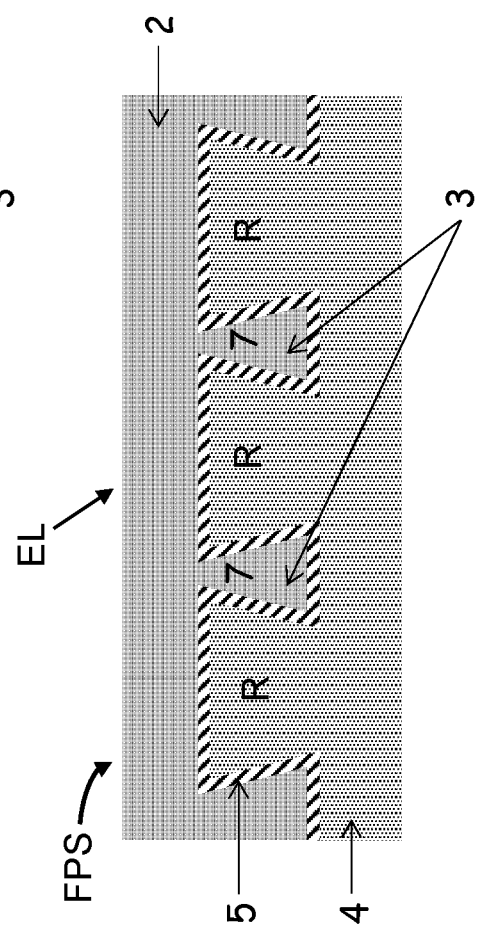

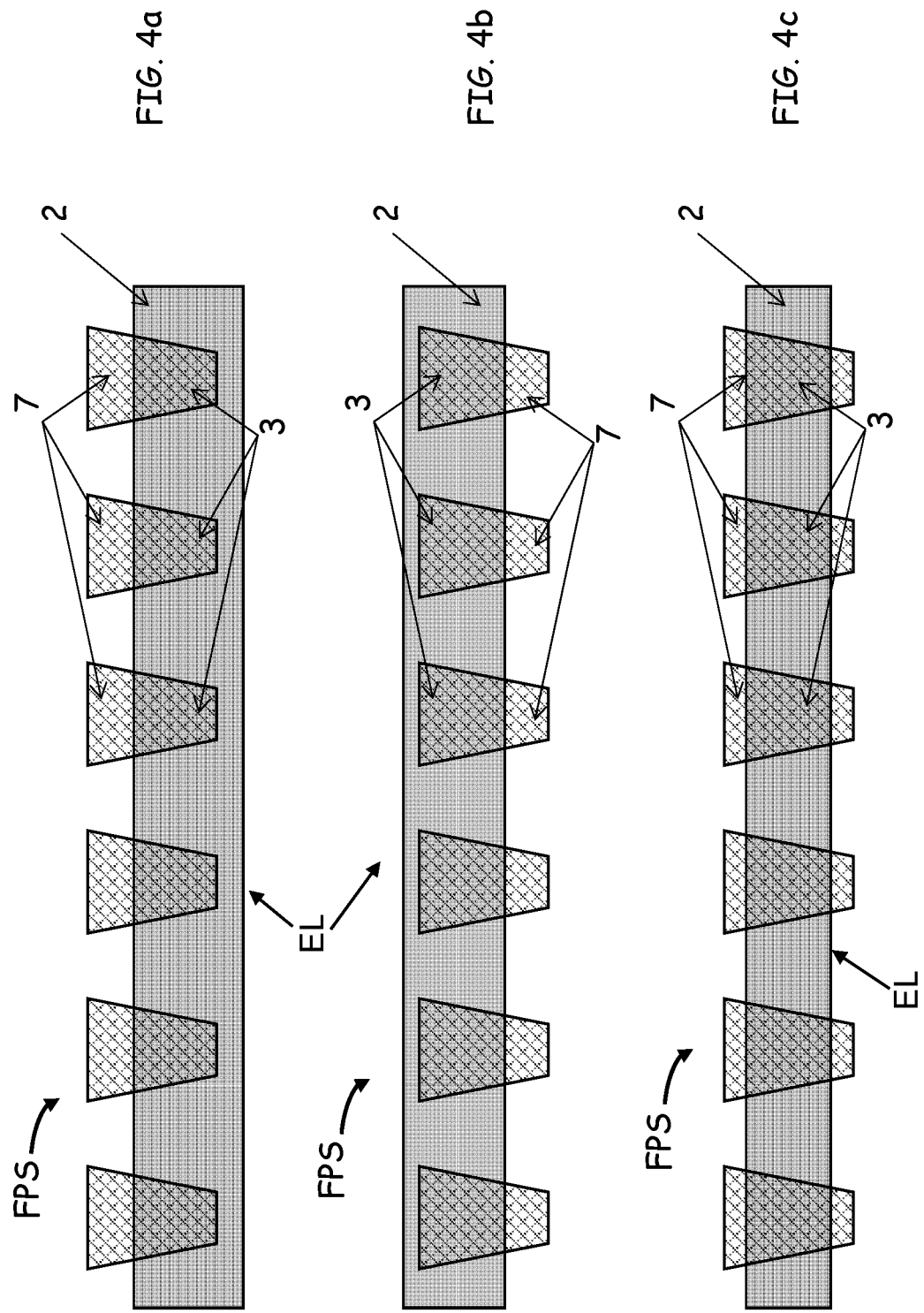

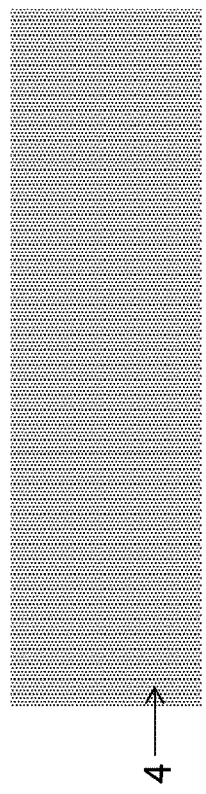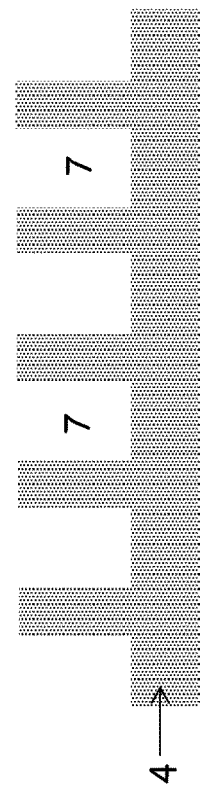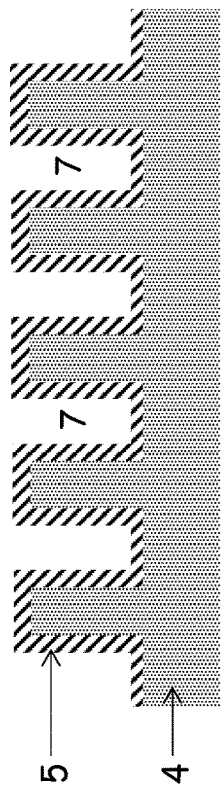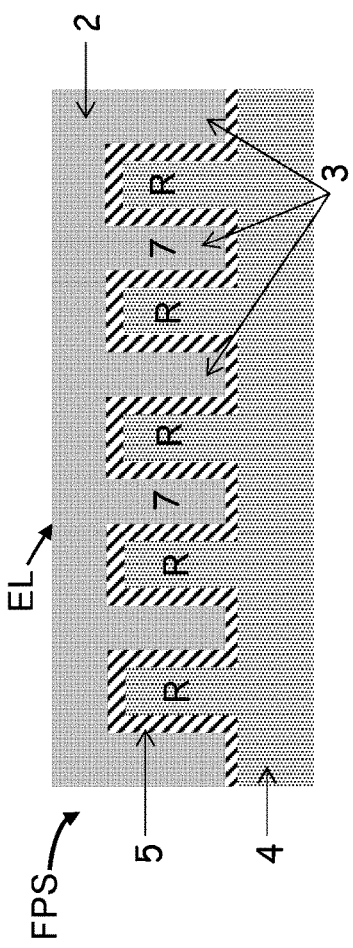

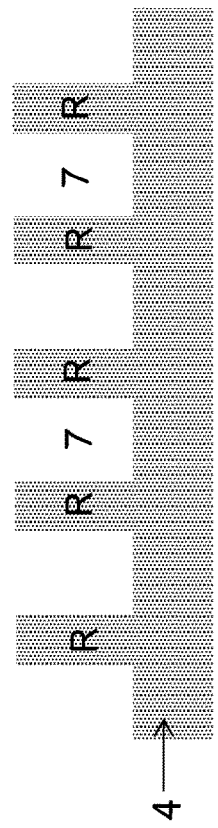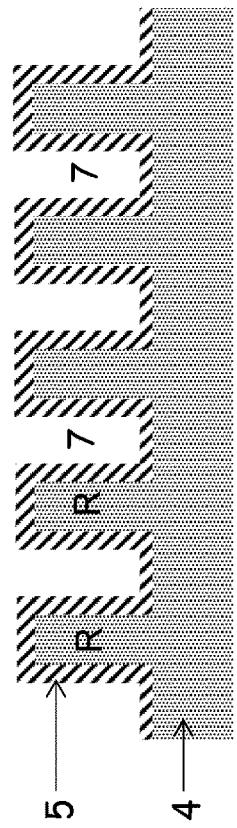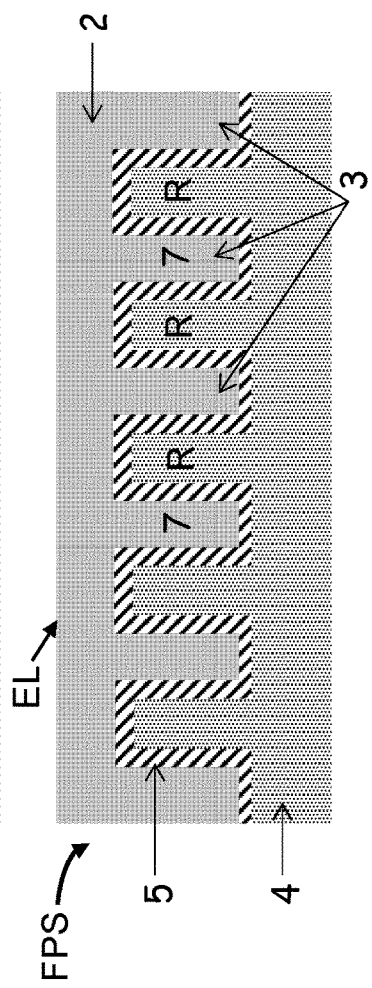

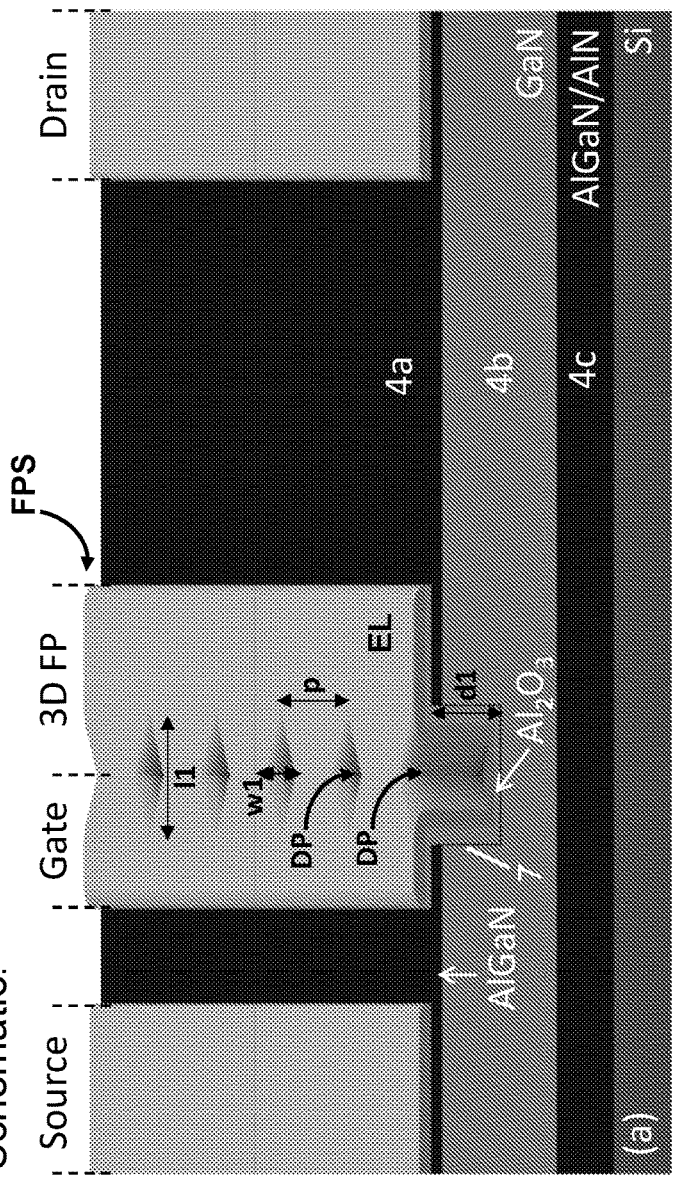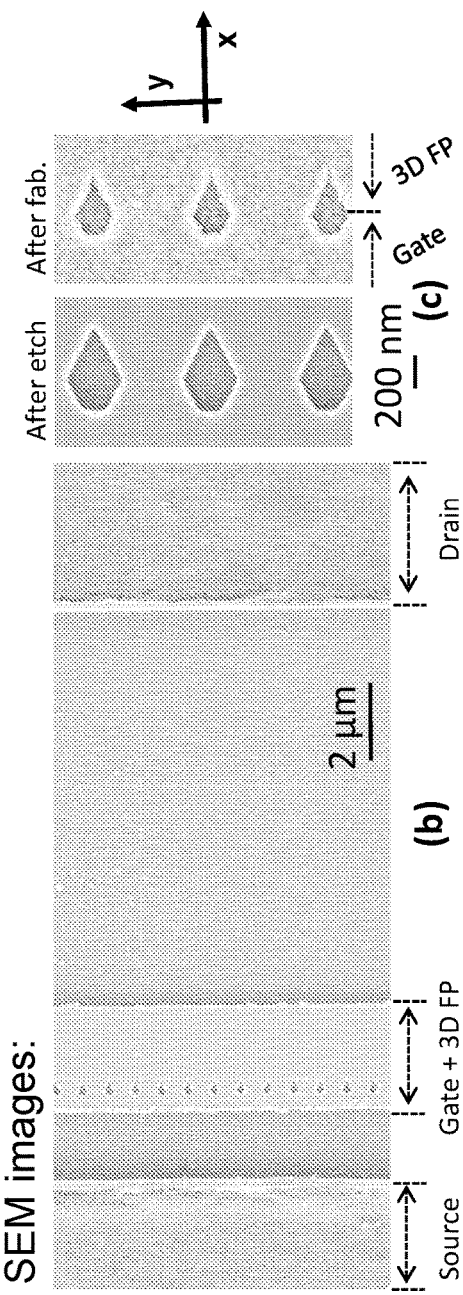
FIG. 10

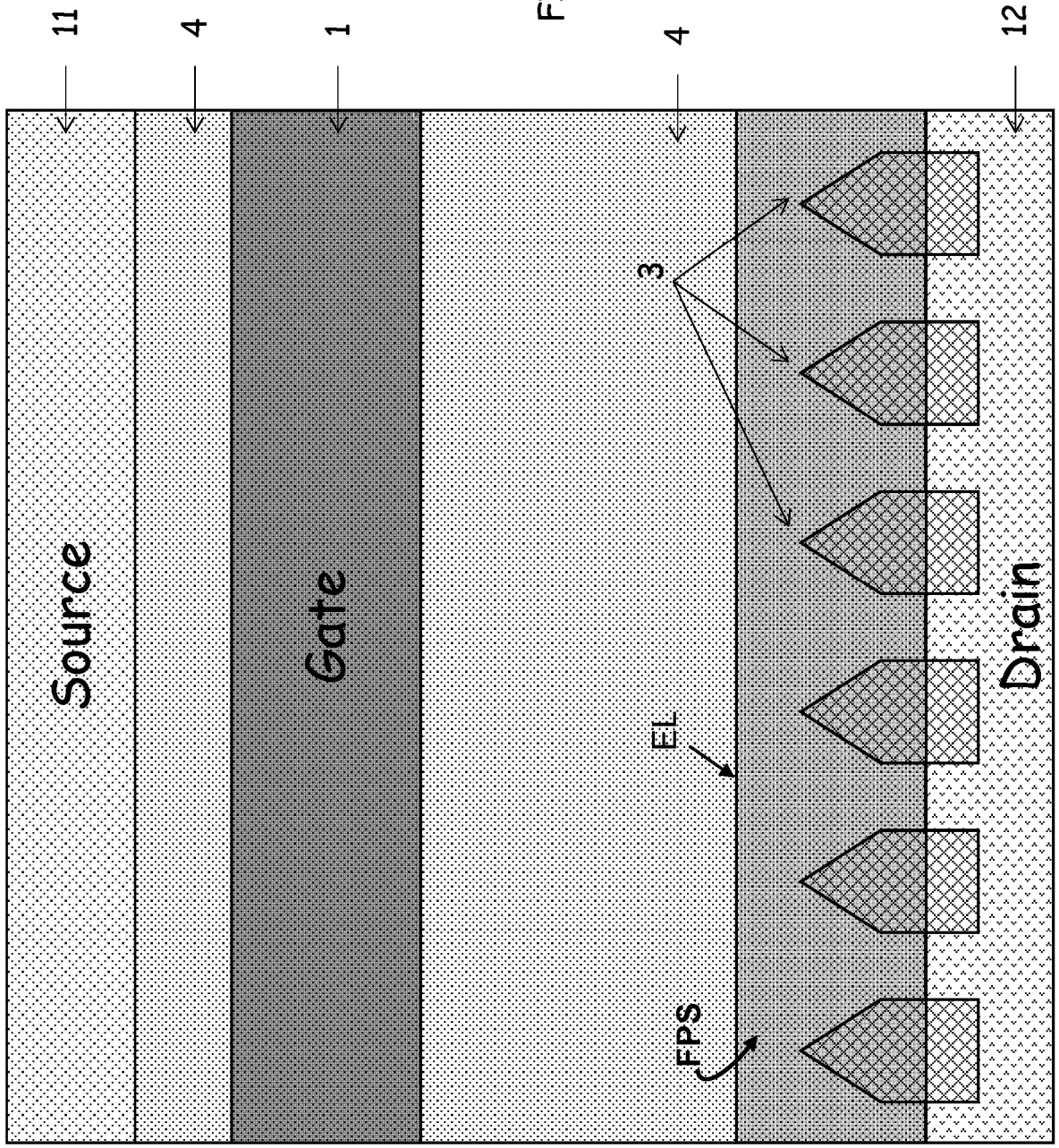

FIG. 22

| | Sub. | Scheme | $V_{RB}$ | $I_R$ (μA/mm) | $V_{ON}$ (V) | $\Delta V_F$ (V) |
|---|---|---|---|---|---|---|
| This work | Si | tri-SCH | -759 ± 37 V at 0.1 μA/mm (grounded sub.) | 0.065 ± 0.011 at -700 V (grounded sub.) | 0.64 ± 0.02 | 0.7 |
| [13] | Si | p-SCH + OHM | -321 V at 1 mA/mm (floating sub.) -200 V at 1 mA/mm (grounded sub.) | ≥ 10 at -75 V (floating sub.) | 0.55 | 1.25 |
| [14] | SiC | p-SCH | -110 V at 10 mA/mm | ≥ 1000 at -20 V | -- | -- |
| [15] | Si | p-SCH + OHM | -685 V at hard breakdown* | ~ 6 at -100 V* | 0.4 | -- |
| [16] | $Al_2O_3$ | p-SCH | -49 V at 1mA/mm | > 100 at -25 V | 1.7 | ≥ 2 |
| [17] | Si | p-SCH + OHM | -- | -- | 1 | -- |
| [18] | Si | p-SCH | -- | ~0.1 at -20 V (floating sub.) | 1.91 | -- |

SEMICONDUCTOR DEVICE COMPRISING A THREE-DIMENSIONAL FIELD PLATE

CROSS-REFERENCE TO RELATED APPLICATIONS

This application is the U.S. national phase of International Application No. PCT/IB2017/055961 filed Sep. 28, 2017 which designated the U.S. and claims priority to U.S. Provisional Patent Application No. 62/400,643 filed Sep. 28, 2016, the entire contents of each of which are hereby incorporated by reference.

FIELD OF THE INVENTION

The present invention relates to a semiconductor device field plate structure for increasing a breakdown voltage of a semiconductor device. The present invention also concerns a semiconductor device including one or more of these field plate structures.

A 3-dimensional (3D) field plate (FP) structure for enhanced voltage blocking in semiconductor devices is described. Compared with conventional planar FP, the 3D FP structure offers a much more flexible design to control the electric field inside semiconductor devices which significantly increases breakdown voltage while guaranteeing ultra-low leakage current. In addition, the fabrication process of the 3D FP structure is much simpler than that of conventional FPs. Exemplary Nitride-based power transistors and Schottky diodes are described as possible embodiments comprising such structures.

The techniques and apparatus described herein relate to semiconductor structures having an electrode structure in which conductive regions are recessed in a semiconductor region, and particularly to semiconductor devices, such as but not limited to nitride-based semiconductor devices, using one or more such electrode structures.

BACKGROUND

FP technology has been widely used to enhance voltage-blocking performance of semiconductor devices such as semiconductor high-frequency and power devices. The FP introduces an additional depletion region in the semiconductor in off state, which relaxes the maximum electric field and improves breakdown voltage of the device.

With an increasing number or a reducing slope of FPs, multiple depletion regions will be introduced, leading to further reduced electric field and an increased breakdown voltage. However, the number of field plates is currently limited to 2 or 3 due to the complexity, cost of fabrication and also control of the slope for conventional in-plane FP is extremely challenging.

Furthermore, GaN has attracted large attention for future power and high-frequency applications, since its superior material properties enable devices operating at higher frequency, higher voltage and higher temperature with much less conduction and switching losses over conventional silicon technology.

III-Nitride semiconductors offer inherent advantages for high-efficiency power electronic devices. Their excellent electronic properties such as a large breakdown voltage at low on-resistance results in a much larger Baliga's Figure of Merit (FOM) than in other materials, such as SiC and Si. GaN-based heterostructures is able to create channels with high-density two-dimensional electron gas (2DEG) with high mobility, enabling lateral high electron mobility transistors (HEMTs) and Schottky barrier diodes (SBDs) with simultaneously fast switching, high power density and high breakdown voltage. This material enables higher efficiency, smaller device size, higher temperature and frequency operation, which is ideal material for future efficient power conversion systems.

The future adoption of GaN lateral devices for efficient power conversion depends strongly on their ability to block high voltages in off-state. However, the voltage blocking performance of current GaN devices are still away from their theoretical limit. Defining the breakdown voltage ($V_{br}$) at leakage current of 1 µA/mm, $V_{br}$ demonstrated in the literature is still below 1400 V for GaN HEMTs on Si. The performance of GaN-based Schottky barrier diodes (SBDs) is still poorer than that of HEMTs. Only a few SBDs with $V_{br}$ larger than 500 V have been reported to date and the highest value is about 900 V, along with leakage current a few orders of magnitude higher than that of state-of-the-art GaN HEMTs.

In GaN lateral power electronic devices, the large potential applied to one of its terminals induces high electric fields, typically at corners of conductive electrodes, electric contacts, schottky junctions, device edges, gate electrodes, etc . . . When the peak electric field reaches the critical electric field of the material, it causes device breakdown. Approaches to protect regions from high electric peaks have so far relied on two-dimensional structures, such as field plates, in which conductive pads placed over such regions are used to reduce the peak electric field below them.

SUMMARY

The present invention addresses the above-mentioned inconveniences and problems and provides a semiconductor device including a field plate structure according to claim 1. This field plate structure permits to increase a breakdown voltage of the semiconductor device while avoiding the above-mentioned inconveniences.

The present invention also concerns a field plate structure. Further advantages features are present in the dependent claims.

Some embodiments relate, for example, to a field effect device or transistor that includes a source region and a drain region. The field effect transistor also includes a semiconductor material or region between the source region and the drain region. The semiconductor material or region includes or has recesses of any geometry or geometries (rectangular, round, diamond, irregular, etc.) between the source region and the drain region. The recess or recesses are part of the field plate structure of the present disclosure. The field effect transistor also includes or has a gate region which is a conductive electrode that can have conductive regions in, or partially in or out of the recesses in the semiconductor material or region.

The field effect transistor also includes one or more FP structures or regions which include or have one or more conductive electrodes having conductive regions formed in, or partially in the recesses. The FP structure or region can be either independent (floating), or connected for example to source, gate or drain regions.

The field effect transistor may also have an insulating region between the semiconductor material or region and the conductive electrodes. The insulating region extends at least partially across an interface between the semiconductor material or region and the conductive electrodes.

Some other embodiments relate, for example, to a diode that includes a cathode region and an anode region. The diode also has a semiconductor material or region having recesses of any geometry or geometries (rectangular, round, diamond, irregular, etc.) between the cathode and the anode regions. The diode also includes one or more FP structures or regions which include or have one or more conductive electrodes having conductive regions formed in or partially in the recesses. The FP structure or region can be either independent or connected, for example, to the anode region. The diode may also have an insulating region between the semiconductor material or region and the conductive electrode, for example of the FP structure/region or structures/regions.

The above and other objects, features and advantages of the present invention and the manner of realizing them will become more apparent, and the invention itself will best be understood from a study of the following description with reference to the attached drawings showing some preferred embodiments of the invention.

A BRIEF DISCRIPTION OF SEVERAL VIEWS OF THE DRAWINGS

In the drawings, each identical or nearly identical component that is illustrated in various Figures is represented by a like reference character. For purposes of clarity, not every component may be labeled in every drawing. The drawings are not necessarily drawn to scale, with emphasis instead being placed on illustrating various aspects of the techniques and devices described herein.

The above object, features and other advantages of the present disclosure will be best understood from the following detailed description in conjunction with the accompanying drawings, in which:

FIG. 1a shows a schematic top view of a 3D FP structure, according to some embodiments;

FIG. 1b shows a schematic cross-sectional view of a 3D FP structure in which lower portions of the electrode structure are formed in trenches in a semiconductor material or region, according to some embodiments;

FIG. 1c shows a schematic cross-sectional view of a 3D FP structure in which lower portions of the electrode structure are formed in trenches in a semiconductor material or region, according to some embodiments;

FIG. 1d shows a schematic cross-sectional view of a FP structure in which an electrode does not fully fill the trenches and is provided on walls and an upper section of semiconductor regions;

FIG. 1e shows a schematic cross-sectional view of a FP structure in which an electrode does not fully fill the trenches and is provided on walls of semiconductor regions;

FIG. 1f shows a schematic cross-sectional view of a FP structure in which an electrode does not fully fill the trenches and is provided on only one wall and an upper section of semiconductor regions;

FIG. 1g shows a schematic cross-sectional view of a FP structure in which an electrode does not fully fill the trenches and is provided on only an upper section of semiconductor regions;

FIGS. 2a-2d show schematic top views of a 3D FP structures with recesses of different shapes, according to some embodiments;

FIGS. 2e-2f show schematic top views of 3D FP structures with recesses of irregular shapes and sizes, according to some embodiments;

FIGS. 3a-3b show schematic cross-sectional views in which 3D FP structures have recesses of different shapes in the transversal plane in which an electrode may fully fill the trenches, according to some embodiments;

FIG. 4a shows a schematic top view of a 3D FP structure in which recesses in the semiconductor extend beyond an area of the chip or device covered by or including an upper portion of the conductive electrode, according to some embodiments;

FIG. 4b shows a schematic top view of a 3D FP structure in which recesses in the semiconductor extend beyond an area of the chip or device covered by or including an upper portion of the electrode on the other side of the conductive electrode, according to some embodiments;

FIG. 4c shows a schematic top view of a 3D FP structure in which recesses in the semiconductor extend beyond an area of the chip or device covered by or including an upper portion of the electrode on both sides of the conductive electrode, according to some embodiments;

Figure 7:
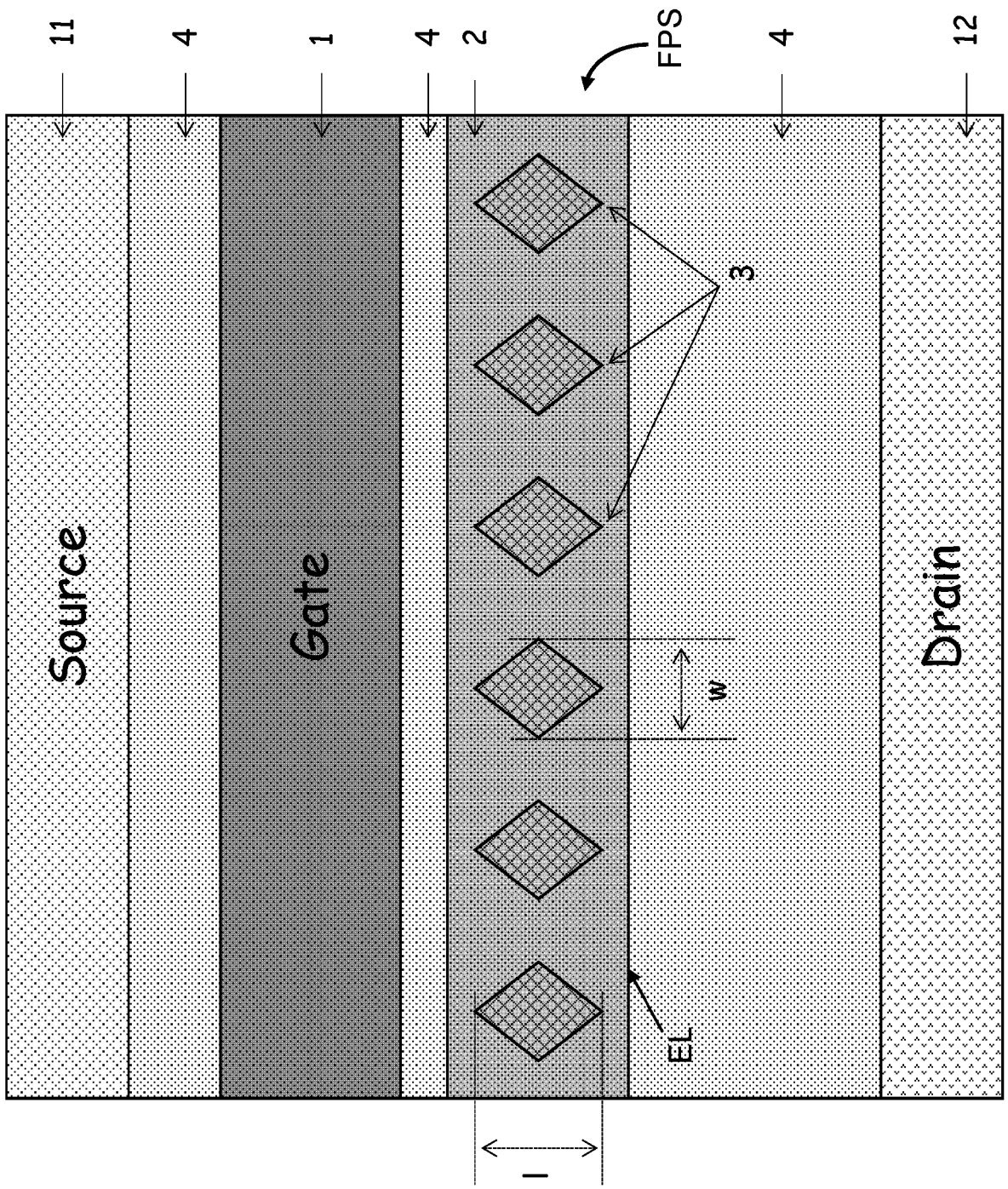
Figure 8A:
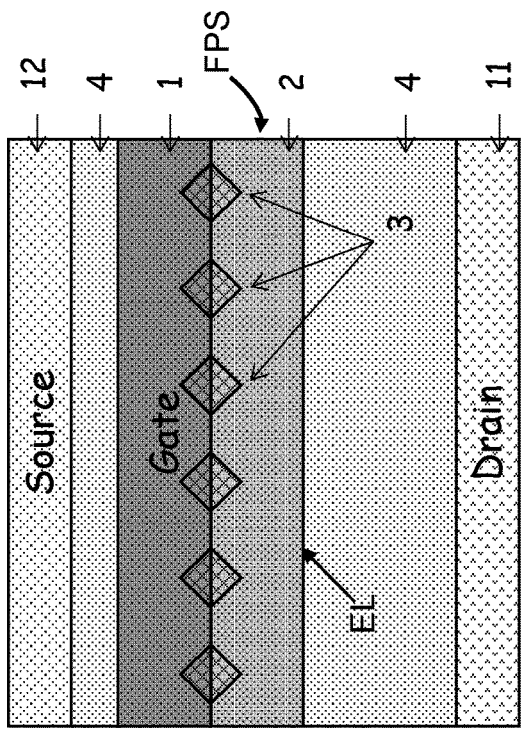
Figure 8B:
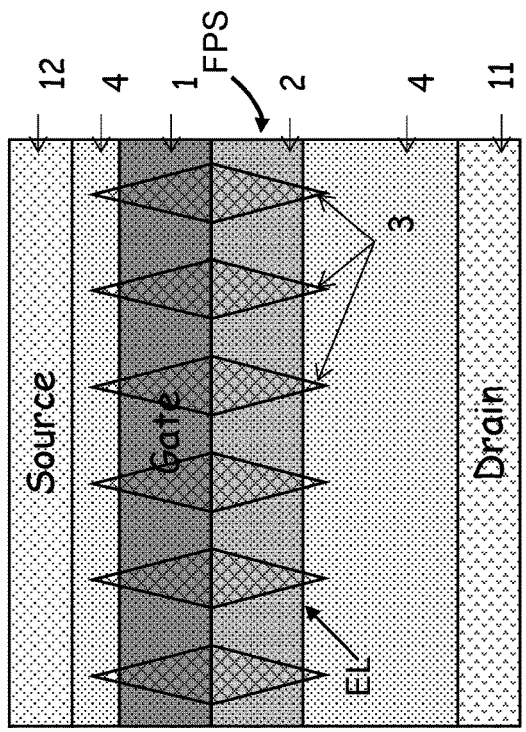
Figure 8C:
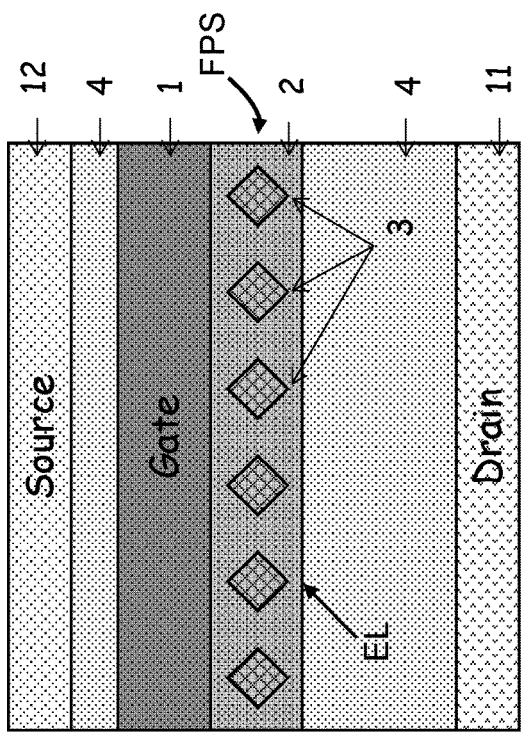
Figure 8D:
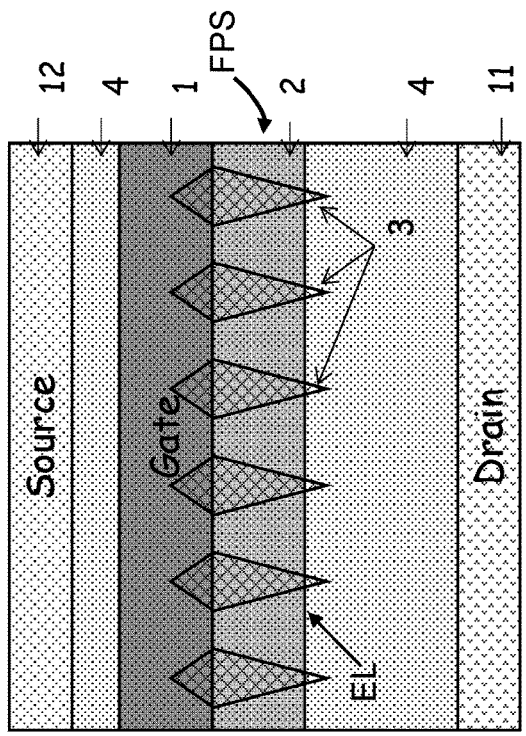
Figure 9A:
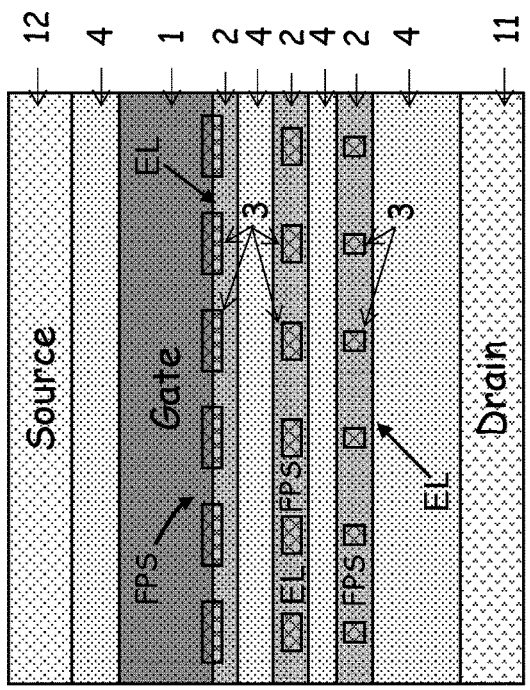
Figure 9B:
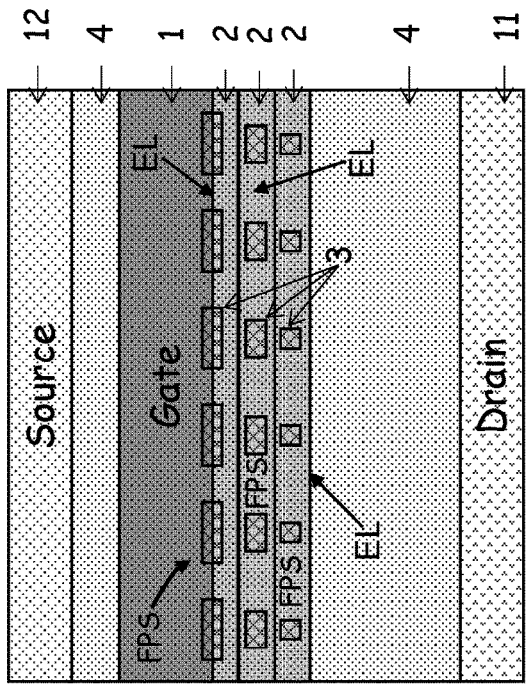
Figure 9C:
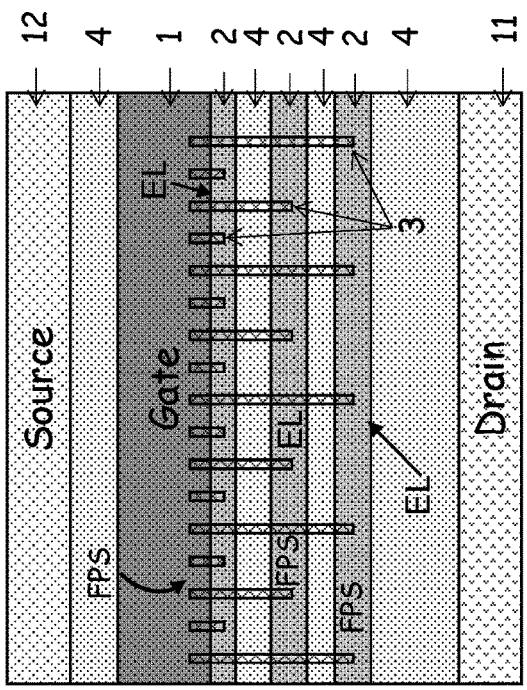
Figure 9D:
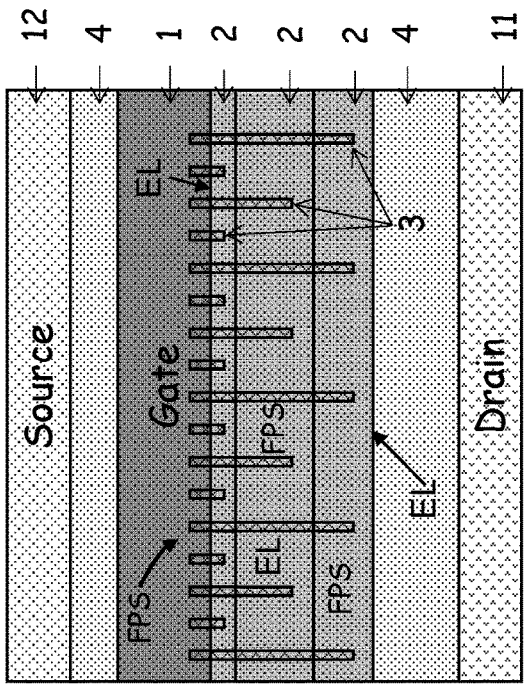
Figure 11A:
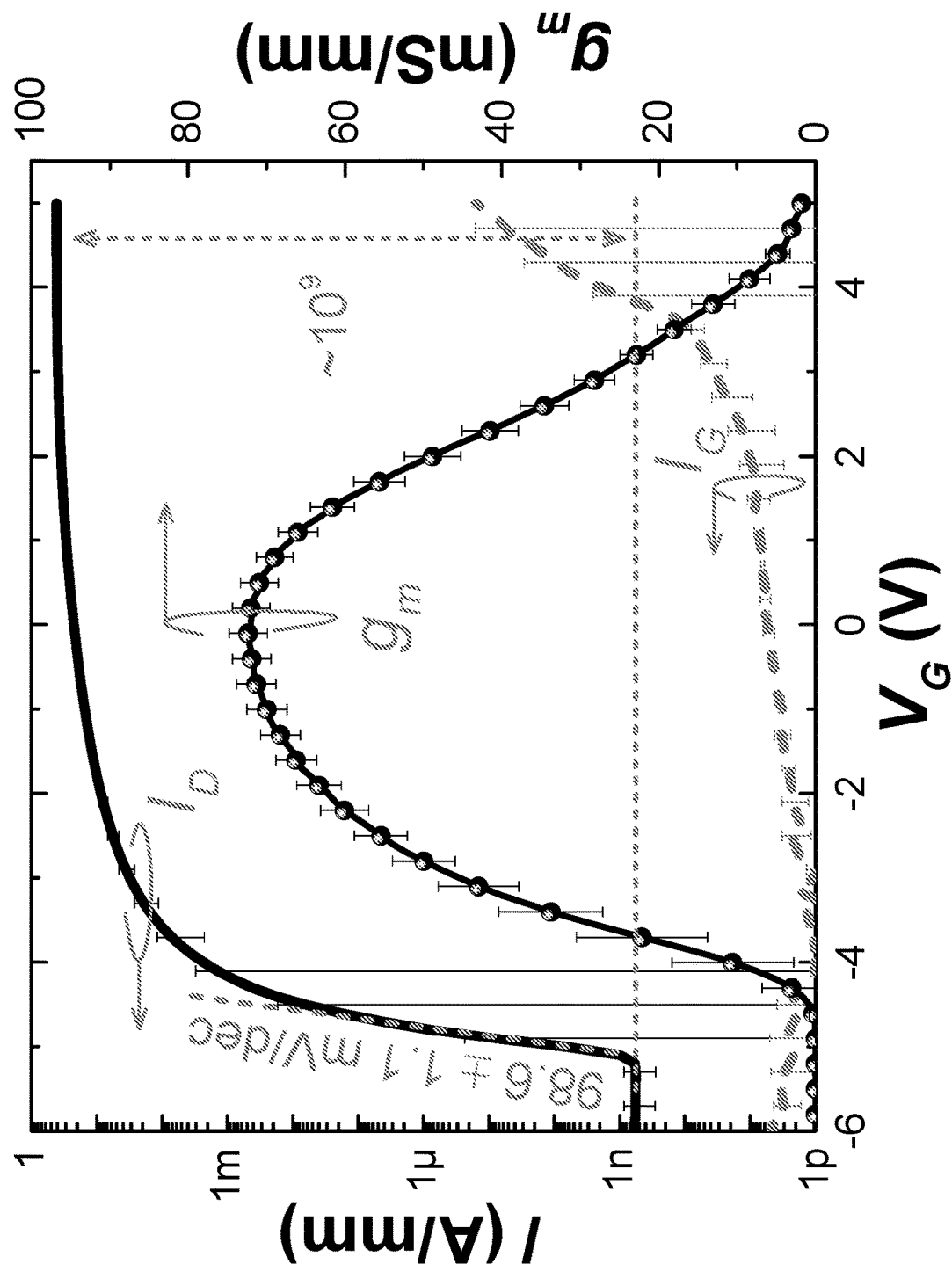
Figure 11B:
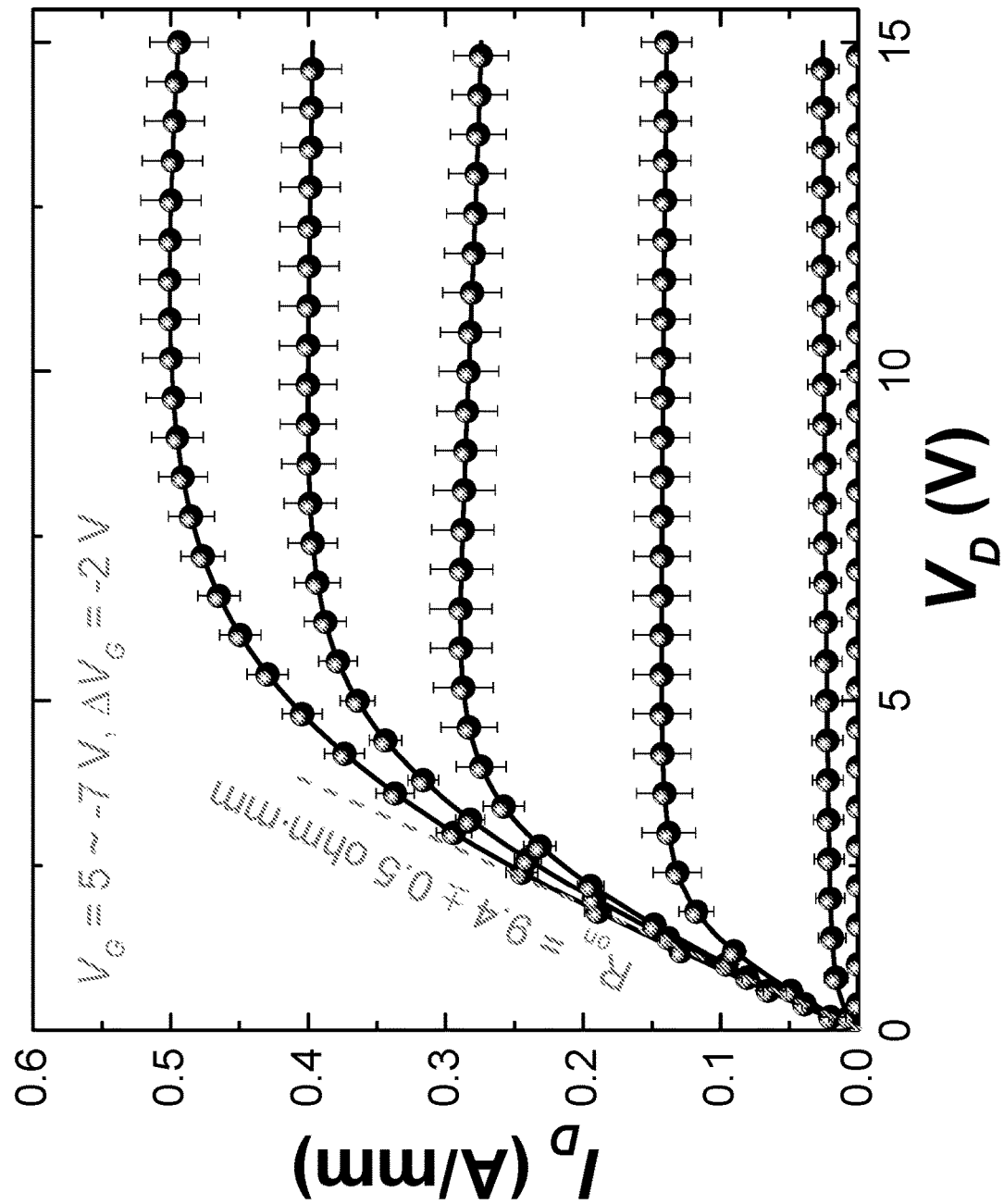
Figure 11C:
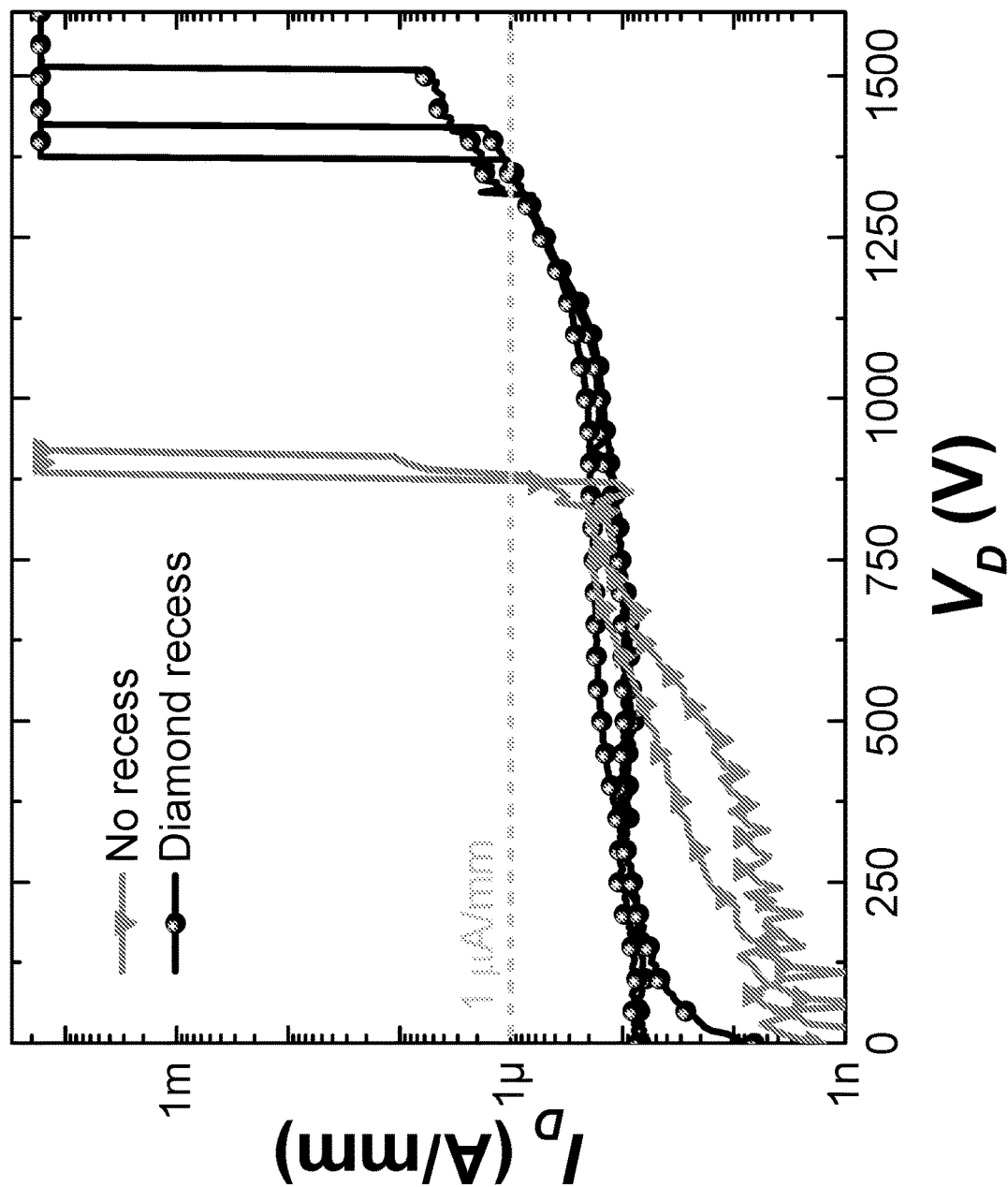
Figure 12:
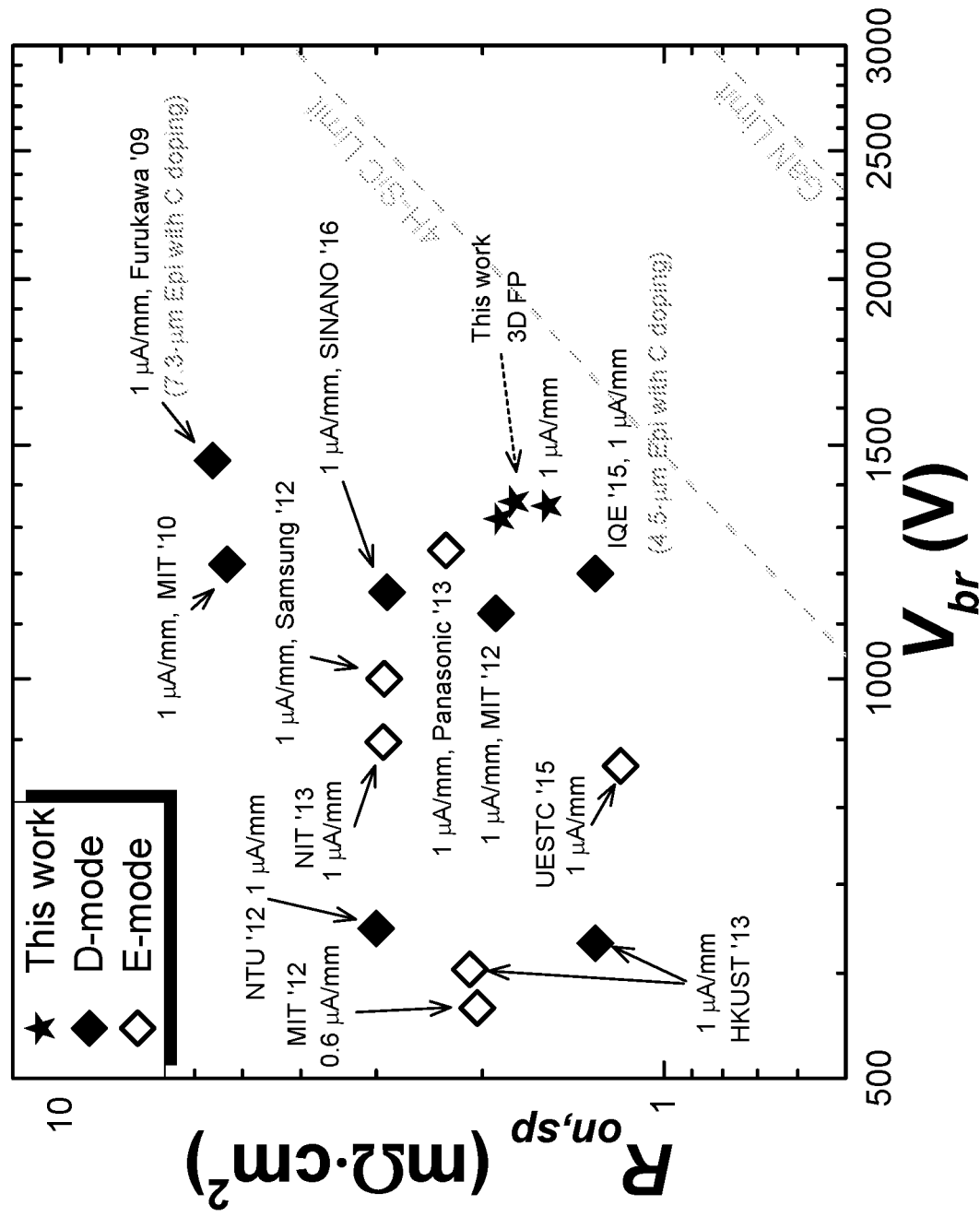
Figure 13:
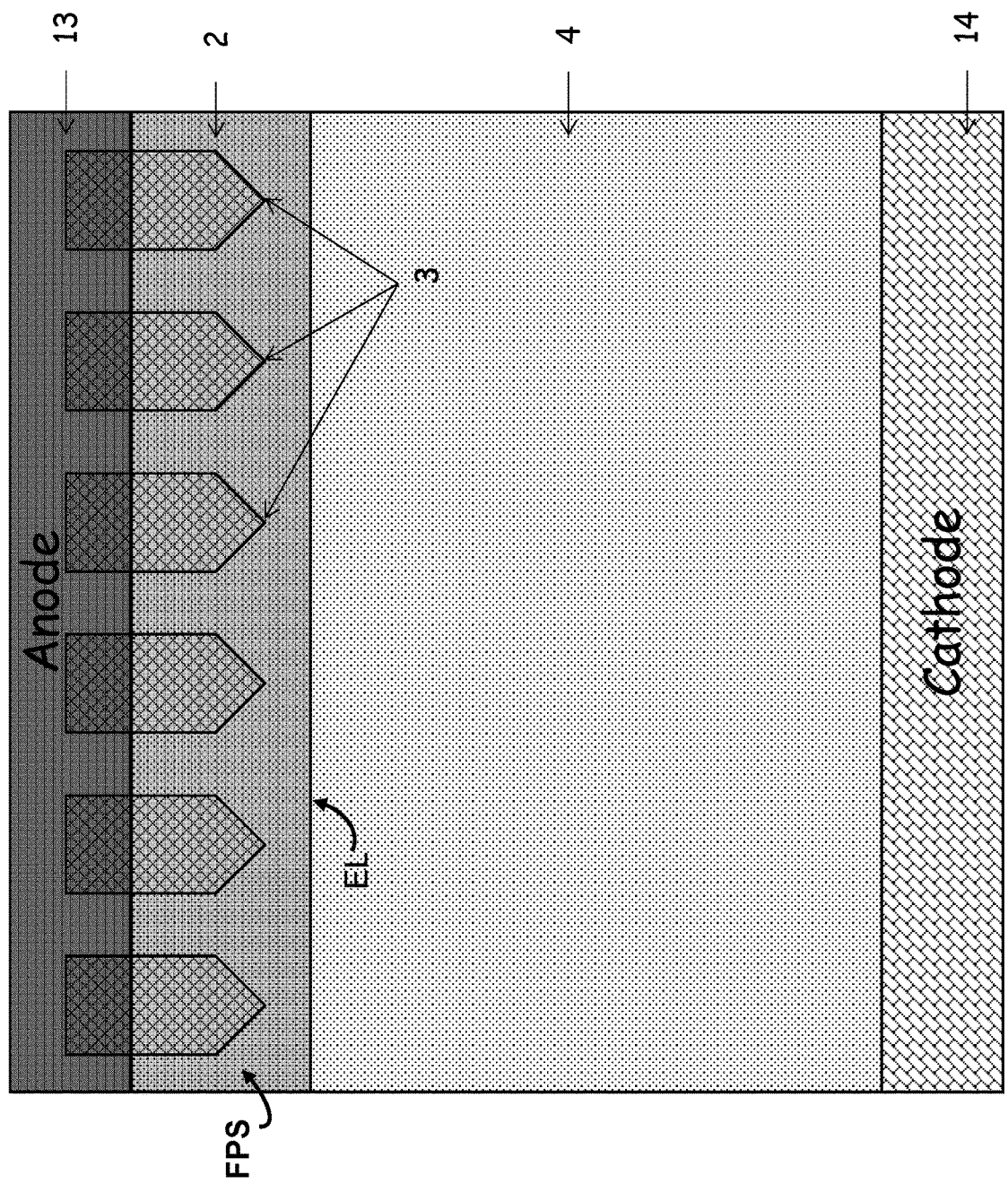
Figure 14:
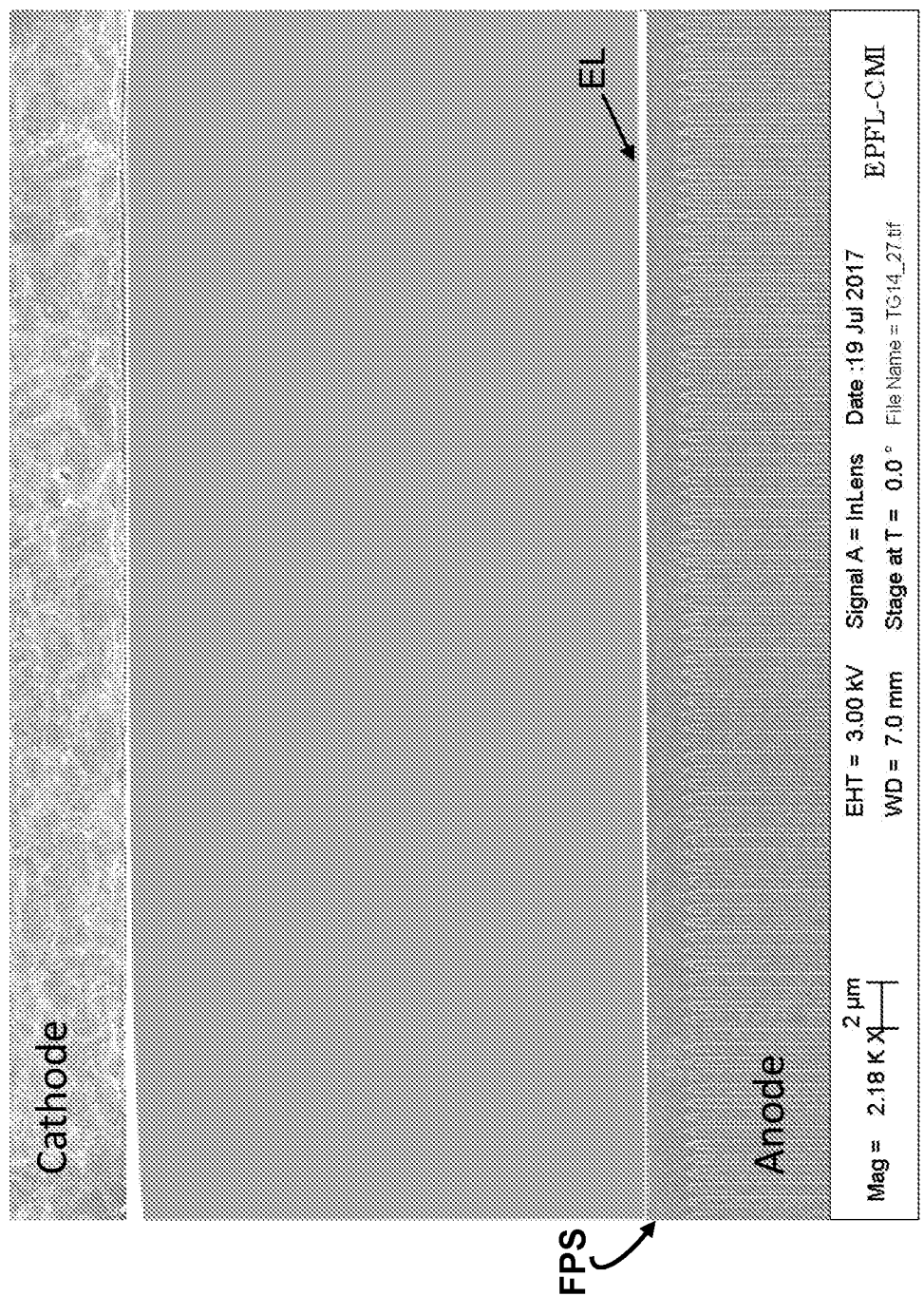
Figure 16:
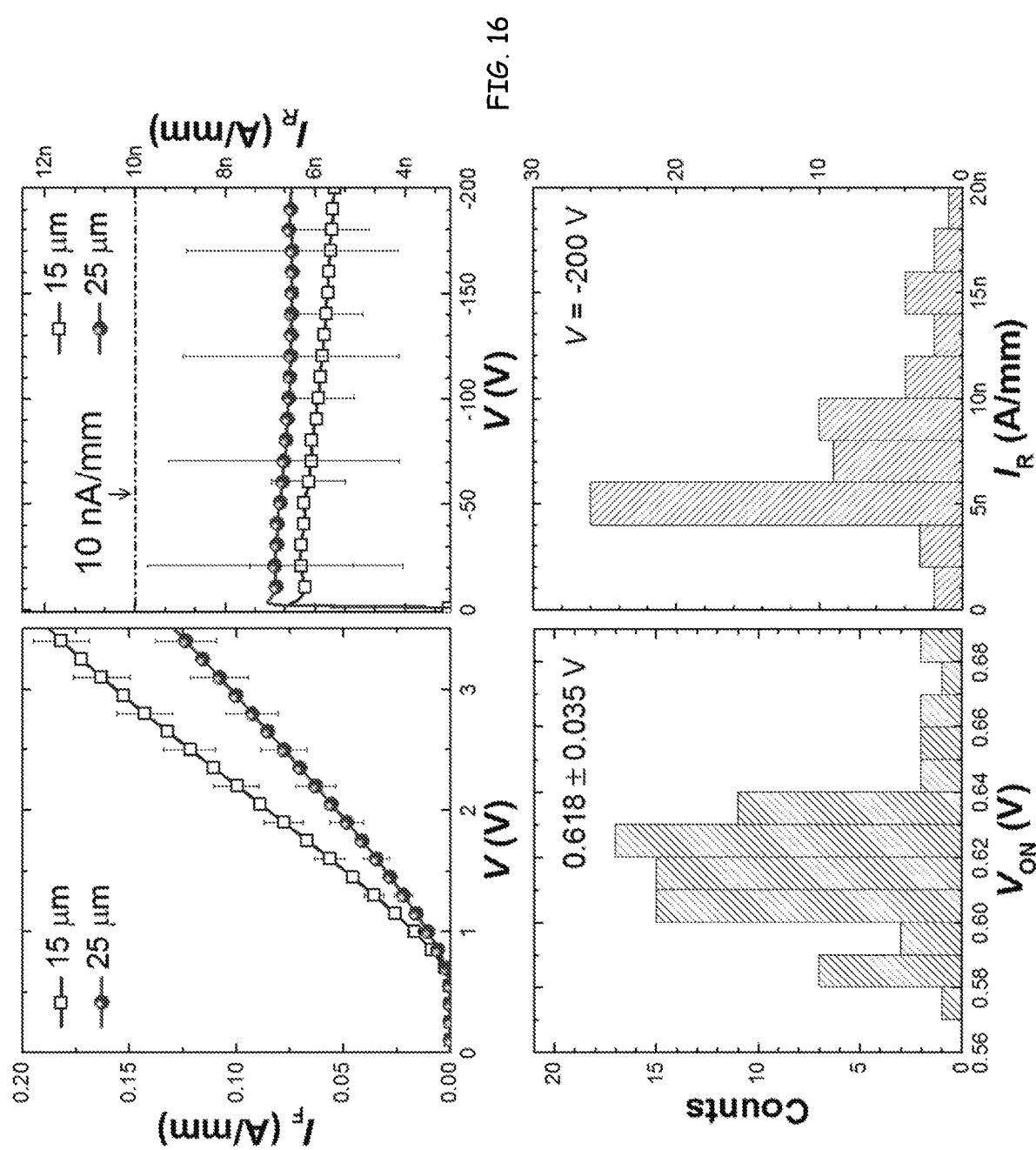
Figure 17A:
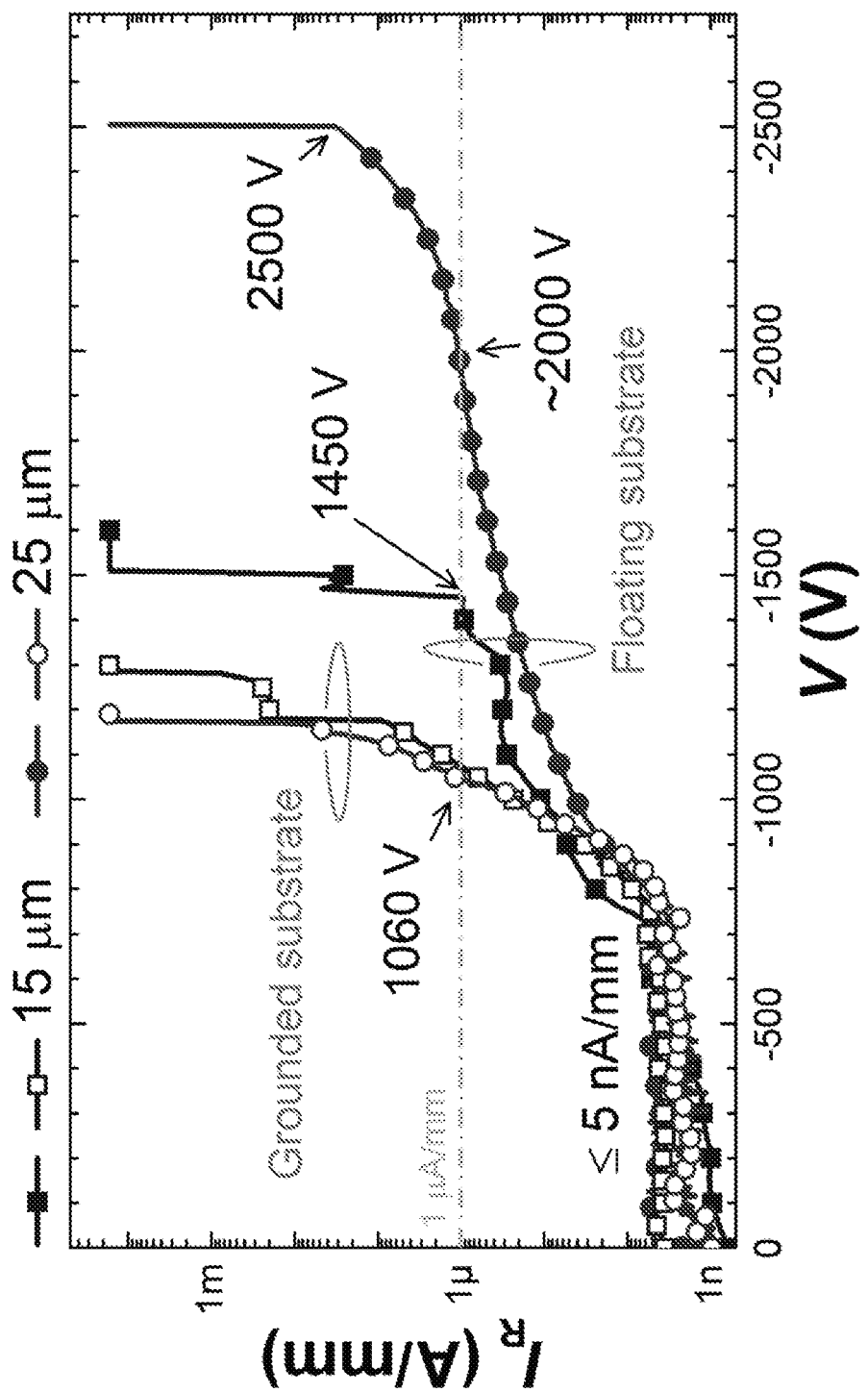
Figure 17B:
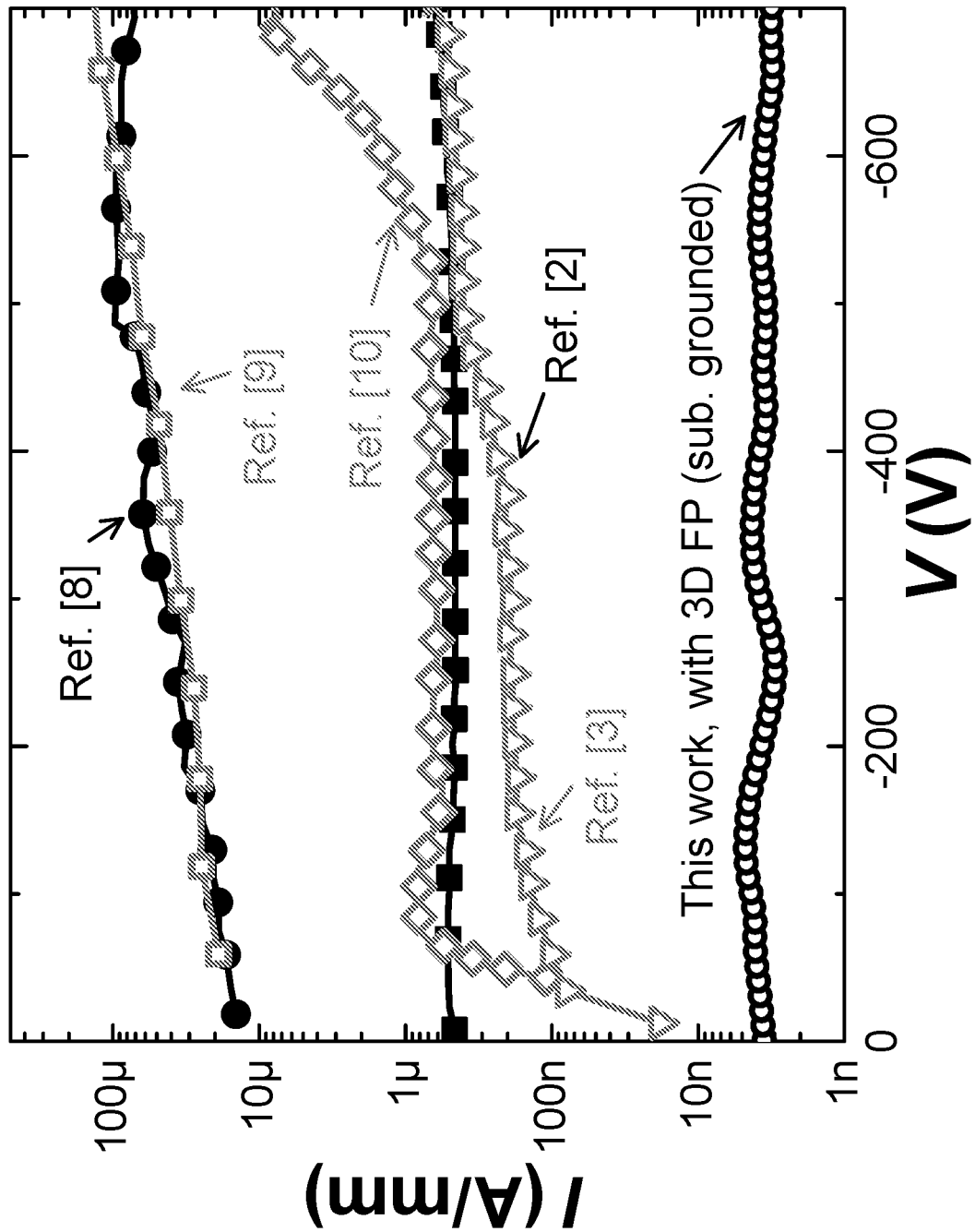
Figure 18:
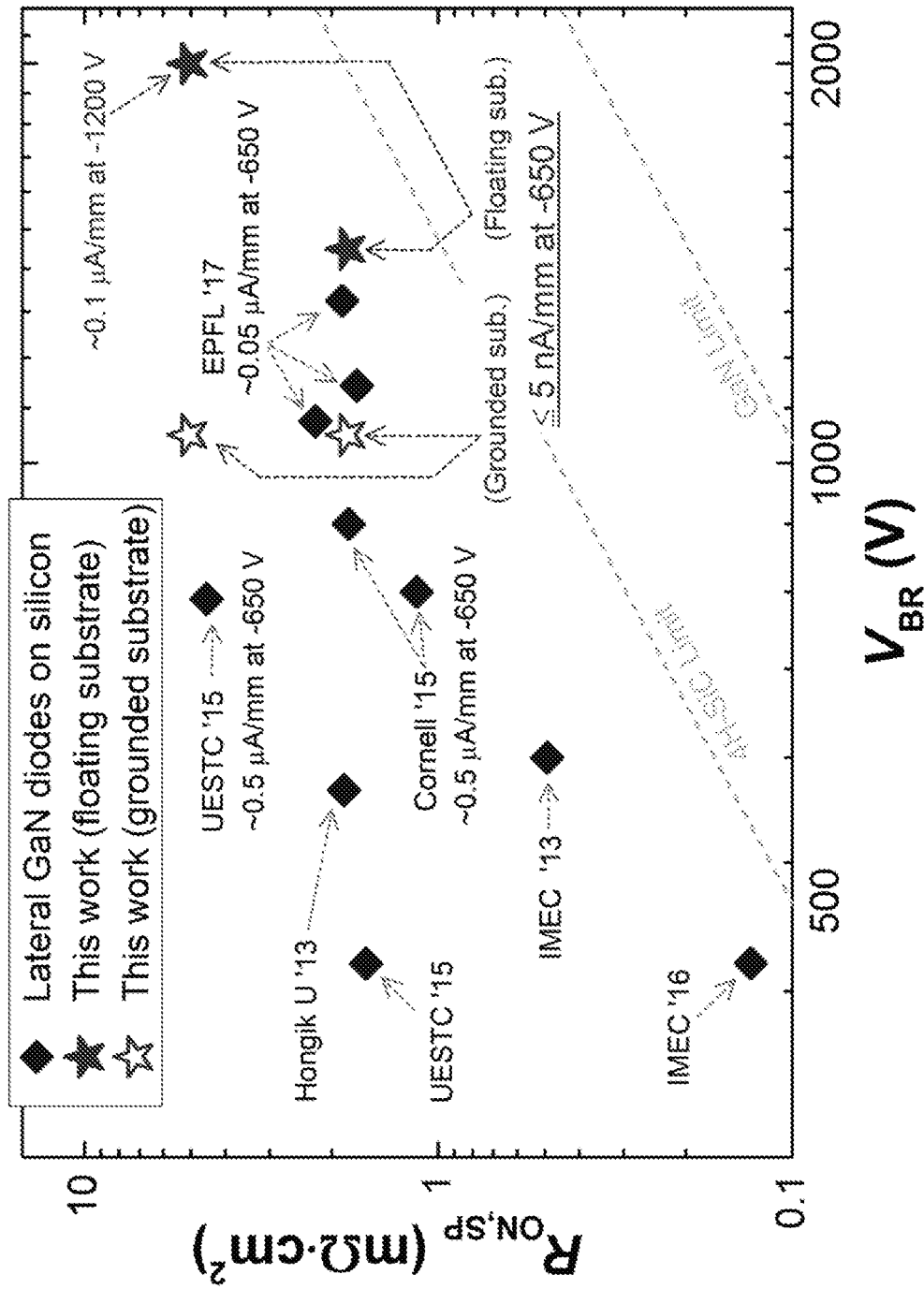
Figure 19B:
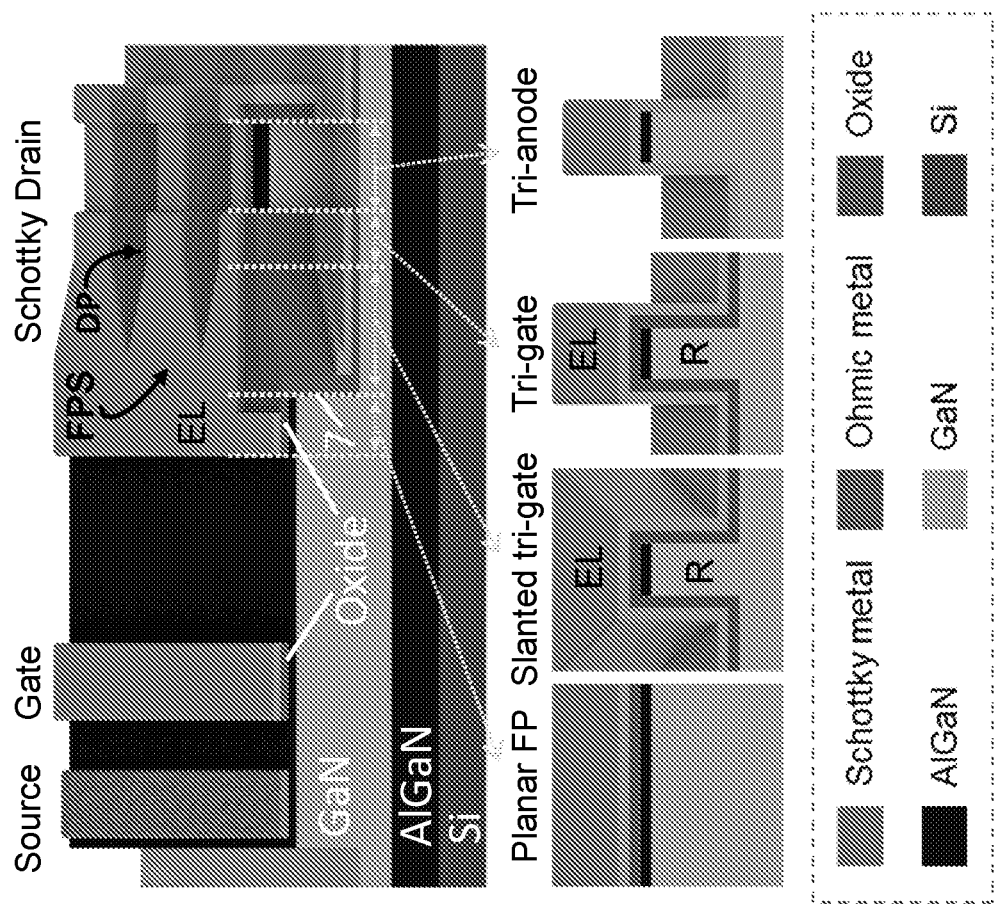
Figure 19C:
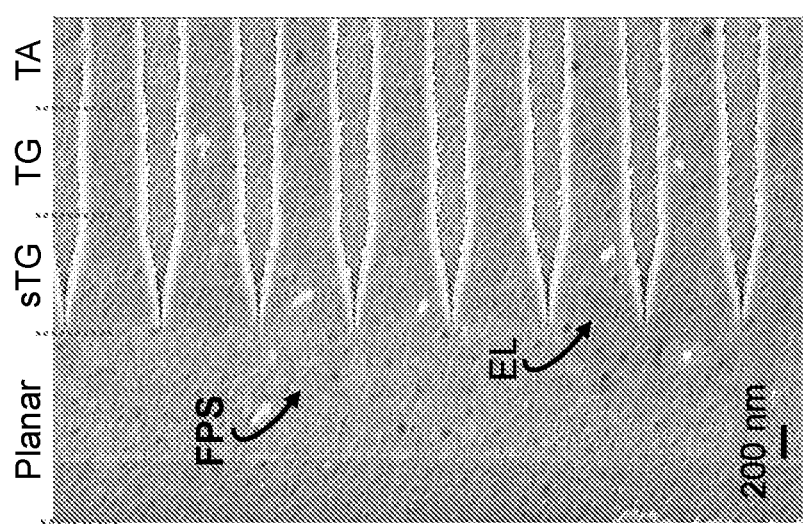
Figure 20A:
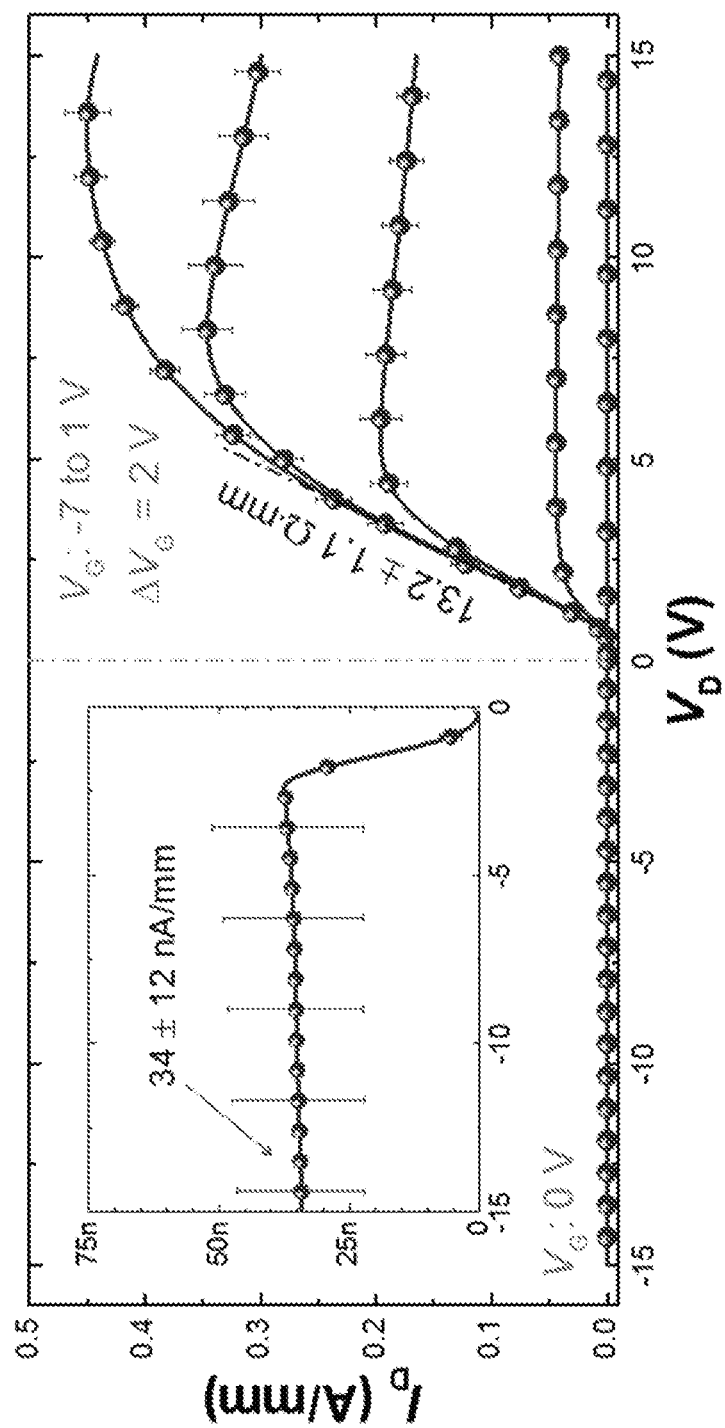
Figure 20B:
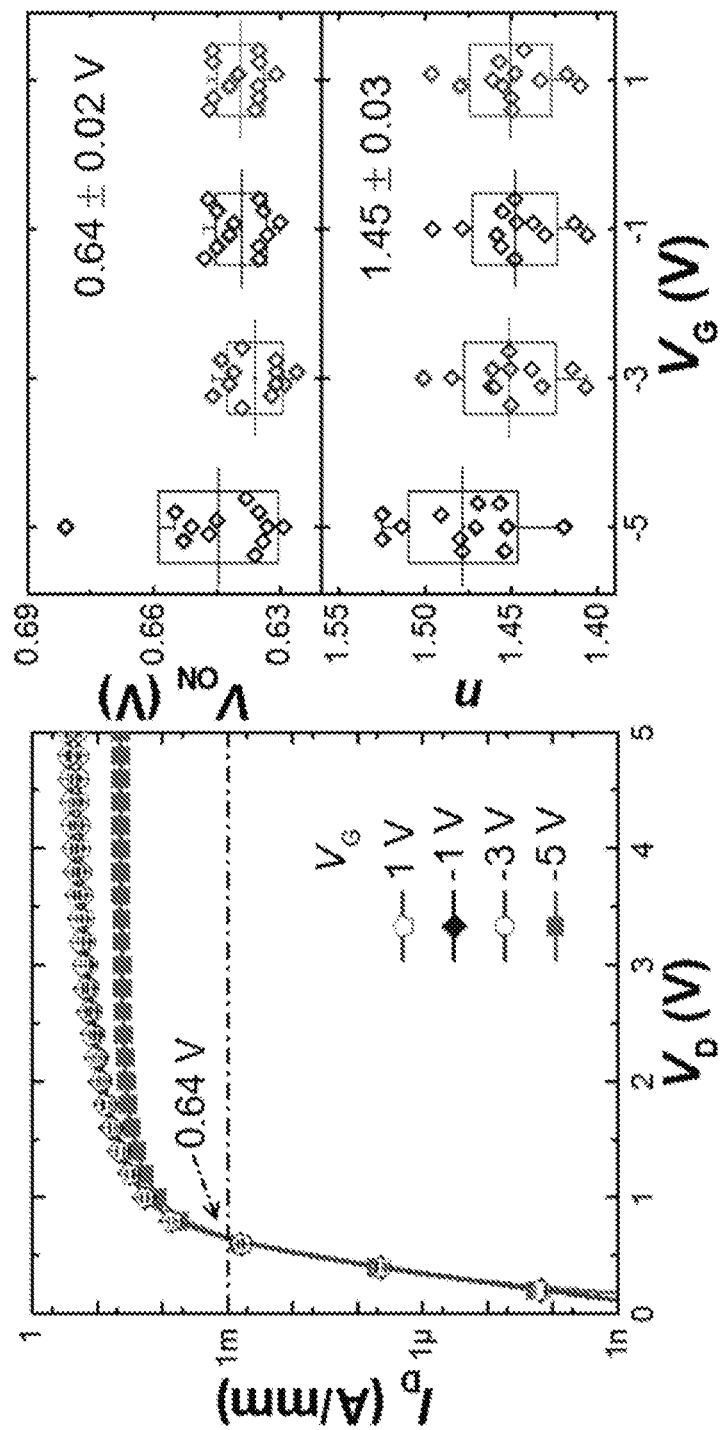
Figure 21:
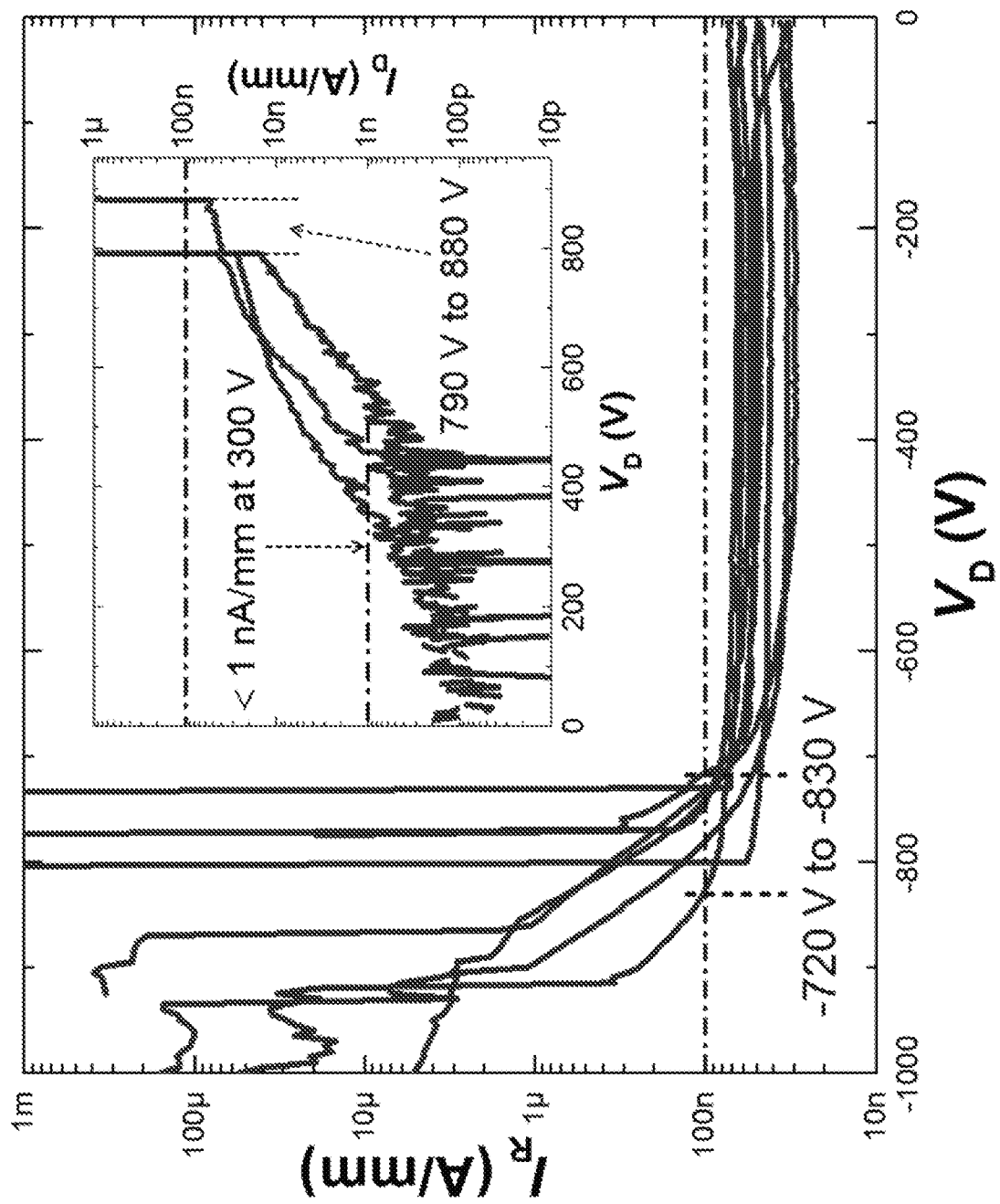

FIGS. 5a-5d schematically show an exemplary fabrication process of the 3D FP structure by selective recess, according to some embodiments;

FIGS. 6a-6d schematically show another exemplary fabrication process of the 3D FP structure by selective material deposition, according to some embodiments;

FIG. 7 schematically shows a top view of an exemplary field effect transistor in which a 3D FP structure or region is floating, according to some embodiments;

FIG. 8a shows a schematic top view of an exemplary field effect transistor in which the 3D FP structure is connected to a gate region and the recesses are only in the 3D FP structure or region, according to some embodiments;

FIG. 8b shows a schematic top view of an exemplary field effect transistor in which the 3D FP structure is connected to a gate region and the recesses are both in the 3D FP structure and gate region, according to some embodiments;

FIG. 8c shows a schematic top view of an exemplary field effect transistor in which the 3D FP structure is connected to a gate region and the recesses extend out from an electrode of the 3D FP structure or region and also into the gate region, according to some embodiments;

FIG. 8d shows a schematic top view of an exemplary field effect transistor in which the 3D FP structure is connected to a gate region and the recesses extend out from an electrode of the 3D FP structure or region and also into the gate region as well as the semiconductor material or region, according to some embodiments;

FIG. 9a shows a schematic top view of an exemplary field effect transistor in which multiple 3D FP structures or regions are included, according to some embodiments;

FIG. 9b shows a schematic top view of an exemplary field effect transistor in which multiple 3D FP regions or structures are included and connected to each other, according to some embodiments;

FIG. 9c shows a schematic top view of an exemplary field effect transistor in which multiple 3D FP regions or structures are included with recesses of different sizes, according to some embodiments;

FIG. 9d shows a schematic top view of an exemplary field effect transistor in which multiple 3D FP regions or structures are included and connected with recesses of different sizes, according to some embodiments;

FIGS. 10a to 10c show schematic and scanning electron microscope images of an embodiment of an exemplary field effect transistor including a FP structure comprising or having an electrode structure according to one embodiment of the present disclosure and as described further herein;

FIGS. 11a and 11b show the on-state performance of an embodiment of a 3D FP structure GaN transistor;

FIG. 11c shows a plot of leakage current as a function of $V_{DS}$ of an embodiment of a GaN transistor with and without a 3D FP structure revealing the enhancement in breakdown voltage;

FIG. 12 shows a plot of $R_{on,sp}$ versus $V_{br}$ benchmarking for various transistor technologies;

FIG. 13 shows a top view schematic of a diode in which 3D FP region or structure is connected to the anode, according to some embodiments;

FIG. 14 shows a top view scanning electron microscope image of an embodiment of a diode having a 3D FP structure as described herein;

FIG. 15a is a schematic of the diode of FIG. 14 in which the FP structure connected to the anode is shown in more detail;

FIG. 15b is a scanning electron microscope image of the FP structure connected to the anode;

FIGS. 15c to 15f show further details of the FP structure connected to the anode and shows respectively a planar field plate section, a slanted tri-gate section, a tri-gate section and a tri-anode;

FIG. 16 shows the forward and reverse characteristics of an embodiment of 3D FP structure GaN diodes;

FIG. 17a shows a plot of leakage current as a function of voltage of prototype GaN diodes with a 3D FP structure;

FIG. 17b shows a plot comparing leakage currents of state-of-the-art GaN diodes as a function of voltage;

FIG. 18 shows a plot benchmarking various diode technologies;

FIGS. 19a-c show a reverse-blocking transistor with 3D FP structure or region connected to the drain, according to some embodiments;

FIGS. 20a and 20b show the forward and reverse characteristics of an embodiment of the reverse-blocking GaN transistor with a 3D FP structure;

FIG. 21 shows a plot of leakage current as a function of V of the reverse-blocking GaN transistor with 3D FP structure; and FIG. 22 shows a plot benchmarking various reverse-blocking technologies.

DETAILED DESCRIPTION OF SEVERAL EMBODIMENTS

An exemplary semiconductor device including a field plate structure FPS according to the present disclosure is shown for example in FIG. 7. The semiconductor device includes a first electrode 11, a second electrode 12 and a semiconductor material or layer 4 located between the first electrode 11 and the second electrode 12.

The semiconductor material or layer 4 can be for example an active region of the semiconductor device that is controlled to permit functioning of the semiconductor device.

The device may include one or more additional semiconductor materials or layers below the material or layer 4 as can be seen, for example, in FIG. 10a.

The semiconductor device can be for example a lateral semiconductor device.

The field plate structure FPS comprises at least two recesses or trenches 7 in the semiconductor material or layer 4. The two recesses 7 define or delimit a field plate structure semiconductor region or section R between the two recesses 7.

The field plate structure FPS may include a plurality of semiconductor regions R, each one being defined by two recesses 7, the field plate structure FPS thus including a plurality of recesses or trenches 7.

The recesses 7 may extend partially through the semiconductor material or layer 4, or one of the two recesses 7 may extend partially through the at least one semiconductor material or layer 4. The recess or recesses 7 may alternatively extend fully through the semiconductor material or layer 4.

Where the device includes a plurality of semiconductor materials or layers, the recess or recesses 7 may extend into one or more of these additional semiconductor materials or layers.

The recesses 7 extend a distance along the semiconductor material or layer 4 that is less than a distance between the first and second electrodes.

The recesses 7 and the semiconductor region R can, for example, extend in an elongated manner along a direction extending between the first and second electrodes.

The material or planar layer 4 can for example include a non-recessed portion and a recessed portion including the field plate structure (see for example FIG. 7, FIG. 10 or FIG. 13).

The semiconductor material or layer 4 can be, for example, planar or a planar layer.

The material or layer 4 can, for example, be planar and include a non-recessed portion, and a recessed portion including the field plate structure.

The form of the semiconductor region R is defined by the shape of the recesses 7. The recesses 7 can for example define a slanted semiconductor region R therebetween.

The semiconductor region R can extend in an elongated manner and may, for example, form a (semiconductor) finger as shown for example in FIG. 15b. Different exemplary shapes of the semiconductor region R can be seen from FIGS. 2a to 2h, for example, the region R of FIG. 2d has an 'hour-glass' shape, while the region R of FIG. 2f has a funnel shape.

The field plate structure FPS also comprises a field plate structure electrode EL that is (directly or indirectly) in contact with the semiconductor region R, or that is provided on the semiconductor region R. The electrode EL may cover a portion of the semiconductor region R. FIGS. 1d to 1g show exemplary examples. As shown in FIGS. 1d to 1g, the semiconductor region R may for example include a first side wall S1, a second side wall S2 and an upper landing or surface UL extending between the first S1 and second S2 side walls.

In FIG. 1d, the electrode EL extends along the first side wall S1, the second side wall S2 and the upper surface UL. The electrode EL may also extend into or be present on a floor F of the recess 7. In FIG. 1d, the electrode EL extends across the side walls S1, S2, upper surfaces UL and floors F.

In FIG. 1e, the electrode EL is present on or extends along the first side wall S1, the second side wall S2 and the floor F. In FIG. 1f, the electrode EL is present on or extends along only one side wall, upper surfaces UL and the floor F. In FIG. 1g, the electrode EL is present on or extends along only the upper surfaces UL.

The electrode EL can, for example, be present on or extend along any portion of the region R. The electrode EL can, for example, be present on or extend along only the upper surfaces UL, or only one or both side walls, or only the upper surfaces UL. The electrode may only partially cover these areas of the region R.

The electrode EL may thus be a continuous electrode or comprise a plurality of individual electrodes. For example, the electrode EL of FIG. 1g may comprise five individual electrodes in contact with the upper surfaces UL. Alternatively, the electrode EL may be a continuous electrode that extends to the upper surfaces UL (divides continuously into fives separated electrodes).

The field plate structure FPS may include a plurality of regions R and the electrode EL may for example include a plurality of individual electrodes each located on a different position of the regions R.

The electrode EL may alternatively completely cover the semiconductor region R. FIGS. 1b and 1c show such an exemplary embodiment. The electrode EL includes an upper electrode region 2 and a lower electrode region 3. The lower electrode region 3 extends into the recess 7 to fill the recesses 7. The upper electrode region 2 extends from the top of the recesses 7 and the upper landing UL to cover the semiconductor material or layer 4.

The electrode EL can extend to partially fill one or more recesses 7 to define a depression DP in the recess 7. Such a depression DP is for example shown in FIGS. 1d, 1e, 1f and FIG. 10a. The electrode EP is for example provided on one or all of the walls of the recess 7 and/or on the floor F to define or delimit the depression DP.

The two recesses 7 may, for example, define a semiconductor region R comprising a first side wall S1 and a second side wall S2, where the first side wall S1 and second side wall S2 extending substantially parallel to each other (see for example FIG. 2a). The first side wall S1 and second side wall S2 may alternatively extend convergently or divergently with respect to each other (see for example FIGS. 2c, 2d).

The first side wall S1 and second side wall S2 may for example include (i) a first portion in which the first side wall S1 and second side wall S2 extend substantially parallel to each other and (ii) a second portion in which the first side wall S1 and second side wall S2 extend convergently or divergently with respect to each other (see for example FIG. 20.

The first side wall S1 and second side wall S2 may extend in a curved manner (see for example FIGS. 2b, 2e).

The first side wall S1 and second side wall S2 may for example include (i) a first portion in which the first side wall S1 and second side wall S2 extend substantially parallel to each other and (ii) a second portion in which the first side wall S1 and second side wall S2 extend in a curved manner (see for example FIG. 2e).

Recesses 7 of different shapes may be used, and the first side wall S1 may extend a shorter distance than the second side wall S2 (see for example FIGS. 2g, 2h).

One or more of the recesses 7 may, for example, extend inside the semiconductor material or layer 4 in a direction non-parallel to an elongated extension direction in which the first and/or second electrode extend.

For example, in the device of FIG. 10, the source and drain electrode extend (substantially) in a y-direction and the recesses 7 extend in the semiconductor layer 4 in a non-parallel x-direction.

An insulator region 5 may optionally be included between the semiconductor region R and the electrode EL.

The semiconductor device can include a plurality of field plate structures FPS. FIGS. 9a to 9d shows exemplary embodiments of devices including a plurality of field plate structures FPS. The field plate structures FPS can be spaced apart between the first electrode and the second electrode (see for example FIG. 9a or 9c). Alternatively, each field plate structure (or a plurality of FPS) can be interconnected to each other (see for example FIG. 9b or 9d).

Each field plate structure FPS can comprise recesses 7 defining a semiconductor region R of different shape and/or different length compared to the other field plate structures.

One or more recesses 7 may extends through a plurality or all of the field plate structures FPS (see for example FIGS. 9c and 9d). The recess 7 may further extend into or under an additional electrode of the device such as a gate, drain or source electrode.

The field plate structure FPS can be, for example, a floating field plate structure, as shown for example in FIG. 7 and 10a.

The electrode EL of the field plate structure FPS can, for example, be directly in contact with the first electrode or the second electrode, or with any electrode of the semiconductor device, for example a gate electrode in the case of a FET device. The electrode EL of the field plate structure FPS can, for example, be directly in contact with an electrode that is, for example, an anode electrode or a cathode electrode, or with a gate electrode of a FET device or a source or drain of a FET device (see for example FIG. 10a or 19b).

The first or second electrode can extend into one or more recesses 7 (see for example FIG. 10a where the electrode is an anode electrode). The first or second electrode can extend into the recesses 7 to contact the electrode EL. The first or second electrode and the electrode EL can partially fill the recesses 7 to define the depression DP in recesses 7 (see for example FIG. 10a).

In FIG. 10 a for example the anode electrode and the electrode EL define an electrode comprising a slanted tri-gate, a tri-gate and tri-anode.

The recesses 7 may include a portion that extends beyond the field plate structure FPS that is electrode-free (see for example FIG. 8c. Similarly, the gate electrode contacting the field plate structure FPS, may include an electrode-free portion that extends beyond the gate electrode (see for example FIG. 8d).

The semiconductor device can be, for example, a field effect device or transistor. The device can be, for example, a High Electron Mobility Transistor, a Metal-Insulator-Semiconductor-HEMT, a Metal-Insulator-Semiconductor Field Effect Transistor, a Junction Field Effect Transistor or a Metal-Semiconductor Field Effect Transistor.

The semiconductor device may be a diode. The first electrode can be, for example, an anode contact that is a Schottky contact, Ohmic contact or a combination of both.

FIG. 1a shows a top view of a 3D FP structure FPS which may be formed in a semiconductor device or chip, according to some embodiments. As shown in FIG. 1a, a 3D FP structure FPS includes the upper electrode region 2 and the lower electrode regions 3 extending downward from the upper electrode region 2. For comprehension reasons, the upper electrode 2 is shown to be transparent for the lower electrode region 3 to be visible in the Figure.

As shown in FIG. 1a, the lower electrode regions 3 may include conductive plates or other regions extending parallel to one another. The lower electrode regions 3 may have a patterned structure. As shown in the example of FIG. 1a, the lower electrode regions 3 may have a periodic structure of a period p.

In some embodiments, semiconductor region 4 includes one or more layers of III-V semiconductor material, such as a III-N semiconductor material including a group III element and nitrogen. Examples of suitable group III-N materials include GaN (Gallium Nitride), $Al_{x1}Ga_{1-x1}N$ (Aluminum Gallium Nitride with any suitable Aluminum content x1) and $Al_{x2}In_{y2}Ga_{z2}N$ (Aluminum Indium Gallium Nitride with any suitable Aluminum, Indium and Gallium contents x2, y2 and z2, respectively, where x2+y2+z2=1 and each of x2, y2 and z2 is greater than or equal to 0 and less than or equal to 1), by way of example.

However, any suitable types of semiconductor materials may be used. In some embodiments, semiconductor region 4 may include a group IV semiconductor such as Si (Silicon) and/or Ge (Germanium) and/or SiC (Silicon Carbide) and/or diamond. However, any suitable type of semiconductor material may be used, not limited to III-V or group IV semiconductors.

Electrode structure 2 and 3 may comprise or be formed of a metal, a metal alloy, or any other suitable conductive material, such as a doped semiconductor material, for example. In some embodiments, a wide bandgap material (e.g., aluminum nitride) may be used.

FIG. 1b shows a cross section of another 3D FP structure FPS. As shown in FIG. 1b, the upper electrode region 2 may be formed over the semiconductor material or layer (or region) 4. The lower electrode regions 3 are recessed within the semiconductor material or layer 4, as lower electrode regions 3 extend downward from the upper electrode region 2 into the semiconductor material or layer 4.

In the example shown in FIG. 1b, the lower electrode regions 3 are formed in trenches 7 in the semiconductor material or layer 4. The lower electrode regions 3 may fill all or a portion of the trenches 7. The recesses 7 have a depth d. The portions of semiconductor material or layer 4 between the trenches 7 are referred to herein as the semiconductor region R or the upwardly-extending portions R of the semiconductor material or layer 4. The depth of the recesses 7 may be from a few nanometers to a few millimeters. The recesses 7 may have a depth, for example, from a few nanometers to hundreds of microns.

FIG. 1c shows the cross section of another embodiment of the 3D FP structure FPS in which the insulating material 5 is present between the semiconductor material or layer 4 and the electrode structure. In such an embodiment, insulating material 5 may be present along the entire interface between the semiconductor material or layer 4 and the electrode structure or a portion of the interface between the semiconductor material or layer 4 and the electrode structure. Any suitable type of insulating material may be used for insulating material 5 such as dielectrics including oxides (e.g., silicon oxide), nitrides (e.g., silicon nitride), etc.

FIGS. 2a-h show top views of 3D FP structure with recesses 7 of different sizes and shapes. Any suitable shapes and sizes can be used. FIGS. 2a-h are similar to FIG. 1a and show the recesses filled by the lower electrode regions 3.

FIGS. 3a and 3b shows different cross sections of the 3D FP structure FPS, however, different cross-sectional shapes can also be used.

FIG. 4a shows the top view of one variation of an embodiment of a 3D FP structure FPS in which the trenches 7 extend beyond the area of the device or chip covered by the upper electrode region 2 on a first side of the upper electrode region 2. Lower electrode regions 3 may extend into the trenches 7. Lower electrode regions 3 may fill all or a portion of the trenches 7. For example, if lower electrode regions 3 fill a portion of the trenches 7, the lower electrode regions may fill the portion of trenches 7 lying below the upper electrode region 2. The electrode structure may have a cross section as illustrated in FIG. 1b or FIG. 1c, for example.

FIG. 4b shows the top view of one exemplary variation of an embodiment of a 3D FP structure FPS in which the trenches 7 extend beyond the area of the device or chip covered by the upper electrode region 2 on a second side of the upper electrode region 2. Lower electrode regions 3 may extend into the trenches 7. Lower electrode regions 3 may fill all or a portion of the trenches 7. For example, if lower electrode regions 3 fill a portion of the trenches 7, the lower electrode regions may fill the portion of trenches 7 lying below the upper electrode region 2. The electrode structure 1d may have a cross section as illustrated in FIG. 1b or FIG. 1c, for example.

FIG. 4c shows the top view of one variation of an embodiment of a 3D FP structure 2 in which the trenches 7 extend beyond the area of the chip covered by the upper electrode region 2 on both a first side and a second side of the upper electrode region 2. Lower electrode regions 3 may extend into the trenches 7. Lower electrode regions 3 may fill all or a portion of the trenches 7. For example, if lower electrode regions 3 fill a portion of the trenches 7, the lower electrode regions may fill the portion of trenches 7 lying below the upper electrode region 2. The electrode structure may have a cross section as illustrated in FIG. 1b or FIG. 1c, for example.

FIG. 5 shows one exemplary fabrication method of the 3D FP structure FPS in some embodiments, in which the semiconductor material or layer 4 (FIG. 5(a)) is firstly recessed (FIG. 5(b)), followed by formation of an optional insulation region 5 (FIG. 5(c)) and conductive electrode 2 and conductive electrode 3 (FIG. 5(d)). Any suitable recess technique can be used for making the recesses 7 such as dry etching, wet etching, etc.

FIG. 6 shows another exemplary fabrication method of the 3D FP structure FPS, in which the semiconductor material or layer 4 is formed by selective growth (FIGS. 6(a) and (b)), followed by formation of optional insulation region 5 (FIG. 6(c)) and conductive electrode 2 and conductive electrode 3 (FIG. 6(d)). Any suitable selective growth technique can be used for making the recesses 7 such as masked growth, catalyst, etc.

FIG. 7 shows a top view of an example of a field effect transistor formed in or comprising a semiconductor material or layer 4 in which the 3D FP structure FPS is floating.

In some embodiments, the exemplary field effect transistor may be for example a HEMT (High Electron Mobility Transistor), MIS-HEMT (Metal-Insulator-Semiconductor-HEMT), MISFET (Metal-Insulator-Semiconductor Field Effect Transistor), JFET (Junction Field Effect Transistor) or a MESFET (Metal-Semiconductor Field Effect Transistor).

The Field effect transistor includes a source region 11 and a drain region 12. Between source region 11 and drain region 12 is formed a gate region 1, which extends only a portion of the distance between the source region 11 and the drain region 12.

Between the source region 11 and drain region 12, there is the 3D FP region or structure FPS which extends only a portion of the distance between the gate region 11 and the drain region 12.

The 3D FP structure FPS can be connected to the source 11, gate 1, drain 12, or even a few of them together. The number of 3D FP structures FPS can be one or larger than one. The 3D FP region is floating in the exemplary embodiment of FIG. 7 and not connected or directly connected (in contact or direct contact with) to the source 11, gate 1 or the drain 12.

FIGS. 8a to 8d show top views of 3D FP structures connected to the gate 1 with different extensions of the recesses 7. The conductive electrodes in gate 1 and 3D FP structures FPS can be of the same or different conductive materials.

FIG. 8a shows a top view of a field effect transistor in which the 3D FP structure FPS is connected to the gate region 1 and the recesses 7 are only in the 3D FP structure.

FIG. 8b shows a top view of a field effect transistor in which the 3D FP structure FPS is connected to the gate region 1 and the recesses 7 are both in the 3D FP structure FPS and gate region 1.

FIG. 8c shows a top view of a field effect transistor in which the 3D FP structure is connected to the gate region 1 and the recesses 7 extend from the 3D FP structure FPS into the gate region 1.

FIG. 8d shows a top view of a field effect transistor in which the 3D FP structure is connected to the gate region 1 and the recesses 7 extend from the 3D FP structure FPS into the gate region 1 as well as into the semiconductor material or layer 4.

FIGS. 9a to 9d show top views of 3D FP structures with different connections, sizes and shapes. Any possible connections, sizes and shapes can be used.

FIG. 9a shows a top view of a field effect transistor with multiple 3D FP structures FPS, where one 3D FP structures FPS is connected to the gate 1.

FIG. 9b shows a top view of a field effect transistor with multiple 3D FP structures FPS all connected to each other.

FIG. 9c shows a top view of a field effect transistor with multiple 3D FP structures FPS, where the 3D FP structures FPS have recesses 7 and regions R of different lengths and sizes.

FIG. 9d shows a top view of a field effect transistor multiple 3D FP structures FPS similar to those of FIG. 9c and with all 3D FP structures connected to each other.

FIG. 10a shows an example of a prototype device of a GaN transistor which has been fabricated. The AlGaN/GaN epitaxy in this exemplary structure consisted of 3.75-μm buffer, 0.3-μm un-doped GaN (u-GaN), 23.5-nm AlGaN barrier and 2-nm u-GaN cap layers.

Scanning electron microscopy (SEM) images of the tri-gate MOSHEMTs are shown in FIG. 10b and FIG. 10c.

The device fabrication started with e-beam lithography to define the mesa and recesses, which were then etched by $Cl_2$-based inductively coupled plasma and followed by ohmic metal deposition and rapid thermal annealing. The depth (d1) of the recesses 7 formed in the semiconductor layers 4a and 4b was about 160 nm. The width w1 and length l1 for the recesses 7 formed in the semiconductor layers were 350 and 700 nm, respectively, with a period (p) of 750 nm.

Then 20-nm $Al_2O_3$ was deposited by atomic layer deposition as a gate dielectric. The dimensions of the resulting depression DP are thus slightly less than the dimensions of the recess 7 in the semiconductor layers 4a and 4b. Finally, the gate was formed using Ni/Au, which was later used as the mask for removal of the $Al_2O_3$ in access/ohmic regions. AlGaN/GaN transistors with similar dimensions but no recesses were taken as reference.

FIGS. 11a and 11b show the on-state characteristics of the HEMT, indicating good performance. As shown in FIG. 11c, a breakdown voltage as high as 1350 V was measured at a drain leakage current of 1 μA/mm. As shown in FIG. 12, the new device demonstrates the best performance and high breakdown voltage with a record high power FOM of 1.17 GW/cm$^2$ compared to the previous results in literature.

Figure 15:
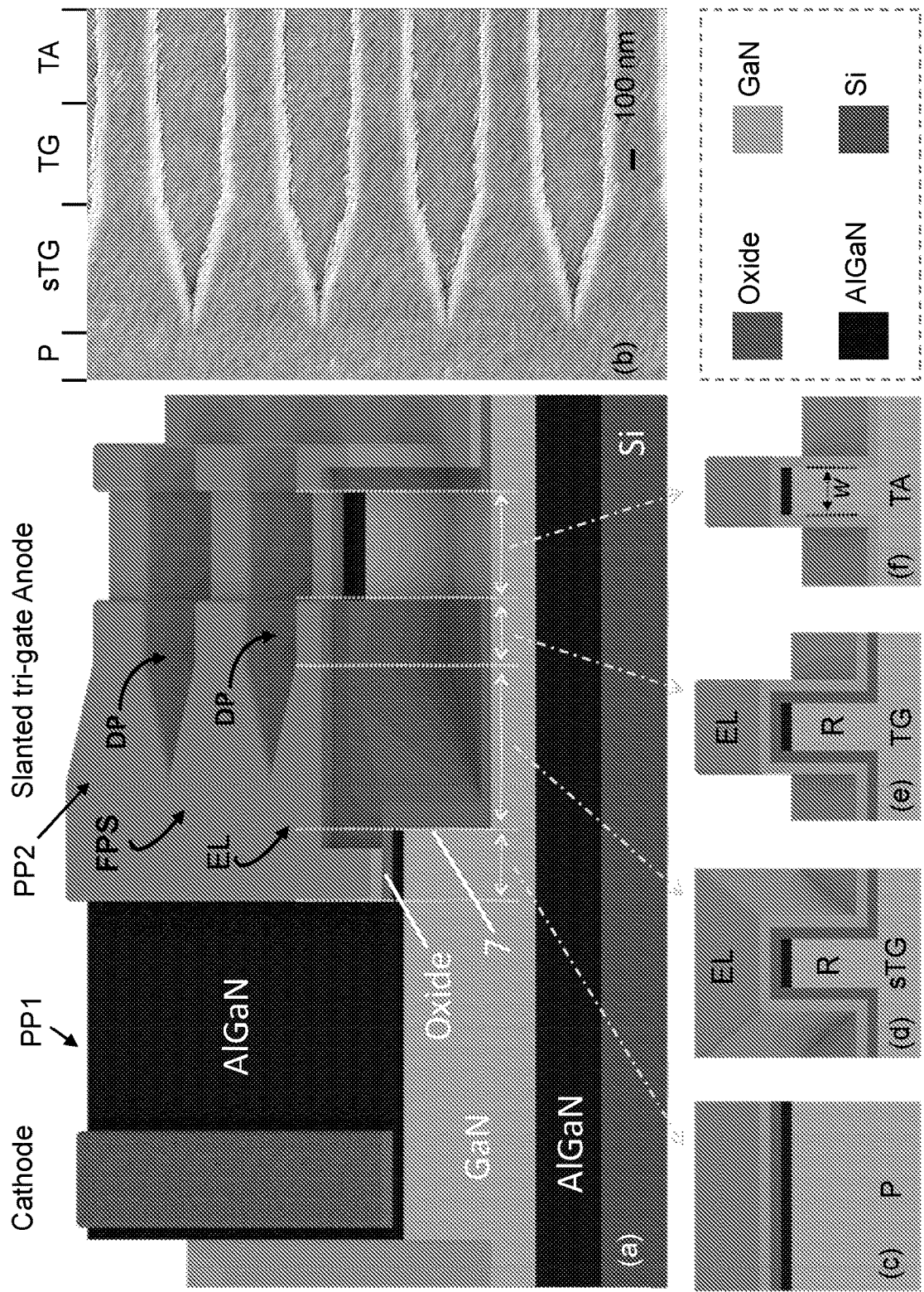

FIG. 13 shows the schematic and FIGS. 14 and 15 show an actual exemplary prototype device of a fabricated GaN diode which includes a 3D FP structure FPS as described herein. FIG. 13 shows a top view schematic of the diode. As shown in FIG. 13, the diode includes an anode region 13 and a cathode region 14 and the 3D FP structure FPS is connected to the anode. FIG. 14 shows a top view scanning electron microscope image of the diode. FIG. 15 shows more details of the diode structure.

FIG. 16 shows the forward and reverse characteristics of the SBDs with the 3D FP structure FPS as shown for example in FIGS. 13 and 14 and 15, exhibiting small turn-on voltage and very small reverse leakage current.

As shown in FIG. 17a, a breakdown voltage as high as 2500 V was measured for the 3D FP structure diode, with a small leakage current of 1 μA/mm up to 2000 V. As also shown in FIG. 17b, the diode also exhibited much smaller leakage current than the results in the literature.

FIG. 18 shows that the new device demonstrates high breakdown voltage and smaller leakage current compared to the any results in literature.

FIGS. 19a-c show the schematic and prototype of an exemplary reverse-blocking GaN transistor fabricated with a Schottky drain 12, which was integrated with 3D FP structure with the 3D FP structure floating.

FIG. 20a shows the excellent performance of the transistor as unidirectional transistor with small reverse leakage current. FIG. 19b shows the small turn-on voltage and good ideality factor (n) of the device, which are both independent of the gate voltage.

FIG. 21 shows the high breakdown voltage of the transistor for both forward and reverse blocking, in which the breakdown was defined at 0.1 μA/mm with a grounded substrate.

FIG. 22 shows the superior performance of the reverse-blocking transistor over any other GaN transistors with a Schottky drain.

The present disclosure describes a field plate structure or 3D field plate structure to increase the breakdown voltage in semiconductor devices while guaranteeing ultra-low leakage current at reverse bias. The fabrication process of the 3D FP structure is much simpler than that of conventional field plates since it integrates the 3D FP fabrication process along with the device fabrication process. Exemplary embodiments concern a 3D FP structure to enhance voltage blocking of GaN lateral HEMTs and SBDs. These 3D FP structure significantly improved the breakdown voltage in transistors from 880 V to 1360 V at an off-state leakage current of 1 μA/mm, resulting in a new record high power FOM of 1.2 GW/cm$^2$.

The 3D FP structure largely improved the breakdown voltage of the SBDs to 2000 V at /R of 1 μA/mm and reduced the reverse leakage current ($I_R$) below 5 nA/mm with blocking voltage up to 700 V, respectively, rendering the highest breakdown voltage and a ultra-small leakage current among GaN lateral SBDs in the literature.

The 3D FP structure was further implemented into the drain electrode of the transistor and led to reverse-blocking GaN transistor with record performance, which is significantly better other similar reports in the literature.

Various aspects of the devices, apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

While the invention has been disclosed with reference to certain preferred embodiments, numerous modifications, alterations, and changes to the described embodiments, and equivalents thereof, are possible without departing from the sphere and scope of the invention. In particular, the features of any one embodiment may be combined with the features of any other embodiment. Accordingly, it is intended that the invention not be limited to the described embodiments, and be given the broadest reasonable interpretation in accordance with the language of the appended claims.

REFERENCES

[1] N. Ikeda, S. Kaya, J. Li, T. Kokawa, M. Masuda, and S. Katoh, "High-power AlGaN/GaN-field plates on Si substrates", in 21$^{st}$ International Symposium on Power Semiconductor Devices & IC's (ISPSD), Barcelona, Spain, 2009.

[2] M. Zhu, B. Song, M. Qi, Z. Hu, K. Nomoto, X. Yan, Y. Cao, W. Johnson, E. Kohn, D. Jena, H. G. Xing, "1.9-kV AlGaN/GaN lateral schottky barrier diodes on silicon", IEEE Electron Device Lett., vol. 36, pp. 375-377, 2015.

[3] Q. Zhou, Y. Jin, Y. Shi, J. Mou, X. Bao, B. Chen, and B. Zhang, "High reverse blocking and low onset voltage AlGaN/GaN-on-Si lateral power diode with MIS-gated hybrid anode", IEEE Electron Device Lett., vol. 36, pp. 660-662, 2015.

[4] E. B. Treidel, 0. Hilt, R. Zhytnytska, A. Wentzel, C. Meliani, J. Winfl, and G. Trankle, "Fast-switching GaN-based lateral power schottky barrier diodes with low onset voltage and strong reverse blocking", IEEE Electron Device Lett., vol. 33, pp. 357-359, 2012.

[5] B. Lu, E. Matioli, and T. Palacios, "Tri-gate normally-off GaN power MISFET", IEEE Electron Device Letters, vol. 33, pp. 360-362, 2012.

[8] J. Ma and E. Matioli, "Improved electrical and thermal performances in nanostructured GaN devices", in International Conference on IC Design and Technology (ICICDT), Ho Chi Minh City, Vietnam, 2016.

[7] C. F. Lo, O. Laboutin, C. K. Kao, K. O'Connor, D. Hill, and W. Johnson, "High-power AlGaN/GaN heterostructure field-effect transistors on 200 mm Si substrates", ESC Transactions, vol. 66, pp. 191-199, 2015.

[8] C. -W. Tsou, K. -P. Wei, Y. -W. Lian, and S. S. H. Hsu, "2.07-kV AlGaN/GaN Schottky barrier diodes on silicon with high Baliga's Figure-of-Merit", IEEE Electron Device Lett., vol. 37, pp. 70-73, 2016.

[9] Y. -W. Lian, Y. -S. Lin, J. -M. Yang, C. -H. Cheng, and S. S. H. Hsu, "AlGaN/GaN Schottky barrier diodes on silicon substrate with selective Si diffusion for low onset voltage and high reverse blocking", IEEE Electron Device Lett., vol. 34, pp. 981-983, 2013.

[10] J. -G. Lee, B. -R. Park, C. -H. Cho, K. -S. Seo, and H. -Y. Cha, "Low turn-on voltage AlGaN/GaN-on-Si rectifier with gated ohmic anode", IEEE Electron Device Lett., vol. 34, pp. 214-216, 2013.

[11] J. Hu, S. Stoffels, S. Lenci, B. Bakeroot, B. D. Jaeger, M. V. Hove, N. Ronchi, R. Venegas, H. Liang, M. Zhao, G. Groeseneken, and S. Decoutere, "Performance optimization of Au-free lateral AlGaN/GaN Schottky barrier diode with gated edge termination on 200-mm silicon substrate", IEEE Trans. Electron Devices, vol. 63, pp. 997-1004, 2016.

[12] J. -H. Lee, C. Park, K. -S. Im, and J. -H. Lee, "AlGaN/GaN-based lateral-type Schottky barrier diode with very low reverse recovery charge at high temperature", IEEE Trans. Electron Devices, vol. 60, pp. 3032-3038, 2013.

[13] C. Zhou, W. Chen, E. L. Piner, and K. J. Chen, "Schottky-Ohmic Drain AlGaN/GaN Normally Off HEMT With Reverse Drain Blocking Capability," IEEE Electron Device Lett., vol. 31, no. 7, pp. 668-670, 2010.

[14] E. Bahat-Treidel, R. Lossy, J. Wurfl, and G. Trankle, "AlGaN/GaN HEMT With Integrated Recessed Schottky-Drain Protection Diode," IEEE Electron Device Lett., vol. 30, no. 9, pp. 901-903, 2009.

[15] J. -G. Lee, S. -W. Han, B. -R. Park, and H. -Y. Cha, "Unidirectional AlGaN/GaN-on-Si HFETs with reverse blocking drain." Appl. Phys. Express, 7 , 014101, 2014.

[16] S. -L. Zhao, M. -H. Mi, B. Hou, J. Luo, Y. Wang, Y. Dai, J. -C. Zhang, X. -H. Ma, and Y. Hao, "Mechanism of improving forward and reverse blocking voltages in AlGaN/GaN HEMTs by using Schottky drain," Chin. Phys. B, 23, 107303, 2014.

[17] Y. W. Lian, Y. S. Lin, H. C. Lu, Y. C. Huang, and S. S. H. Hsu, "AlGaN/GaN HEMTs on Silicon With Hybrid SchottkyOhmic Drain for High Breakdown Voltage and Low Leakage Current," IEEE Electron Device Lett., vol. 33, no. 7, pp. 973-975, 2012.

[18] A. Taube, J. Kaczmarski, R. Kruszka, J. Grochowski, K. Kosiel, K. Golaszewska-Malec, M. Sochacki, W. Jung, E. Kaminska, and A. Piotrowska, "Temperature-dependent electrical characterization of high-voltage AlGaN/GaN-on-Si HEMTs with Schottky and ohmic drain contacts," Solid-State Electron., 111, 12-17, 2015.

The invention claimed is:

1. A semiconductor device including:
a first electrode;
a second electrode;
at least one semiconductor material or layer between the first and second electrode;
the semiconductor device further including at least one field plate structure, the at least one field plate structure comprising:
  at least two recesses in the at least one semiconductor material or layer, the at least two recesses defining a semiconductor region therebetween, and
  a third electrode contacting or provided on the semiconductor region, the third electrode including conductive material,
wherein the semiconductor device further includes a gate electrode, and wherein the third electrode of the at least one field plate structure is directly in contact with the gate electrode, and wherein the semiconductor region comprises a first side wall and a second side wall, the semiconductor device being a lateral semiconductor device and wherein the first side wall and second side wall:
  extend in a curved manner along a direction going from the first electrode to the second electrode; or
  extend convergently and divergently with respect to each other along a direction going from the first electrode to the second electrode; or extend to define an hour-glass shape; or the first side wall extends a shorter or longer distance than the second side wall along a direction going from the first electrode to the second electrode, the at least one field plate structure comprising a further recess defining a further semiconductor region, the further semiconductor region comprising a further first side wall and a further second side wall, the further first side wall and the further second side wall extending a distance different to that of the first side wall; or include (i) a first portion in which the first side wall and second side wall extend substantially parallel to each other along a direction going from the first electrode to the second electrode and (ii) a second portion in which the first side wall and second side wall extend convergently or divergently with respect to each other along a direction going from the first electrode to the second electrode, or (ii) a second portion in which the first side wall and second side wall extend in a curved manner along a direction going from the first electrode to the second electrode; or the first side wall extends a shorter distance than the second side wall along a direction going from the first electrode to the second electrode, and the first side wall and second side wall include (i) a first portion in which the first side wall and second side wall extend substantially parallel to each other along a direction going from the first electrode to the second electrode and (ii) a second portion in which the first side wall and the second side wall extend convergently or divergently with respect to each other along a direction going from the first electrode to the second electrode.

2. The semiconductor device according to claim 1, wherein the at least two recesses extend partially through the at least one semiconductor material or layer, or one of the at least two recesses extends partially through the at least one semiconductor material or layer.

3. The semiconductor device according to claim 1, wherein the at least two recesses extend fully through the at least one semiconductor material or layer, or one of the at least two recesses extends fully through the at least one semiconductor material or layer.

4. The semiconductor device according to claim 1, wherein the at least two recesses extend in a direction non-parallel to an elongated extension direction in which the first and/or second electrode extend, or wherein one of the at least two recesses extend in a direction non-parallel to an elongated extension direction in which the first and/or the second electrode extend.

5. The semiconductor device according to claim 1, wherein the third electrode partially covers or fully covers the semiconductor region.

6. The semiconductor device according to preceding claim 1, wherein semiconductor region includes at least one side wall and/or an upper surface, and the third electrode partially covers or fully covers the at least one side wall and/or the upper surface.

7. The semiconductor device according to claim 1, wherein semiconductor region includes a first side wall, a second side wall and an upper surface extending between the first and second side walls, and the third electrode extends along (i) the first side wall, the second side wall and the upper surface, (ii) the first side wall and the second side wall, (iii) the first or second side wall and the upper surface, or (iv) solely the upper surface.

8. The semiconductor device according to claim 1, wherein the recess includes a floor, and the third electrode extends to partially or fully cover said floor of at least one recess or of each recess.

9. The semiconductor device according to claim 1, wherein the third electrode extends to partially or completely fill at least one recess or each recess in the at least one semiconductor material or layer.

10. The semiconductor device according to claim 1, wherein the third electrode of the at least one field plate structure extends along the first side wall and the second side wall and extends to partially fill the at least two recesses to define a depression inside the third electrode and inside the at least two recesses.

11. The semiconductor device according to claim 1, wherein the at least one semiconductor material or layer is a planar layer comprising at least one non-recessed planar portion and at least one recessed planar portion including the field plate structure.

12. The semiconductor device according to claim 1, wherein the at least two recesses and the semiconductor region extend in an elongated manner along a direction extending between the first and second electrodes.

13. The semiconductor device according to claim 1, wherein the at least one field plate structure further includes:
a plurality of recesses in the at least one semiconductor material or layer, the plurality of recesses defining a plurality of semiconductor regions, two recesses defining one semiconductor region therebetween, and
the third electrode contacting or provided on each semiconductor region.

14. The semiconductor device according to claim 13, wherein the third electrode partially covers or fully covers the plurality of semiconductor regions.

15. The semiconductor device according to claim 1, wherein the device includes a plurality of field plate structures.

16. The semiconductor device according to claim 1, wherein the third electrode of the at least one field plate structure is directly in contact with the first electrode or the second electrode.

17. A semiconductor device including:
a source electrode;
a drain electrode;
at least one semiconductor material or layer between the source and drain electrode;
the semiconductor device being a lateral semiconductor device and further includes at least one field plate structure, the at least one field plate structure comprising:
at least two recesses in the at least one semiconductor material or layer, the at least two recesses defining a semiconductor region therebetween, and
at least a third electrode, the third electrode contacting the semiconductor region and including conductive material, the third electrode extending between the source and drain electrodes,
wherein the semiconductor device further includes a gate electrode, and wherein the third electrode of the at least one field plate structure is directly in contact with the gate electrode, and
wherein the third electrode comprises a first side wall and a second side wall extending between the source and drain electrodes,
and wherein the first side wall and the second side wall of the third electrode extend to diverge away from each other along a direction going from the source electrode to the drain electrode of the lateral semiconductor device.

18. The semiconductor device according to claim 17, wherein the first and second side walls of the third electrode extend to increase a distance between the first and second side walls along a direction going from the source electrode to the drain electrode.

19. The semiconductor device according to claim 17, wherein the first and second side walls of the third electrode extend to linearly diverge away from each other.

20. The semiconductor device according to claim 17, wherein the first side wall and the second side wall of the third electrode only extend to diverge away from each other along a direction going from the source electrode to the drain electrode.

21. The semiconductor device according to claim 17, wherein the first side wall and the second side wall of the third electrode of the at least one field plate structure extend to partially fill the at least two recesses to define a depression inside the third electrode and inside the at least two recesses.

22. A semiconductor device including:
a first electrode;
a second electrode;
at least one semiconductor material or layer between the first and second electrode;
the semiconductor device further including at least one field plate structure, the at least one field plate structure comprising:
  at least two recesses in the at least one semiconductor material or layer, the at least two recesses defining a semiconductor region therebetween, and
  a third electrode contacting or provided on the semiconductor region, the third electrode including conductive material,
wherein the semiconductor device further includes a gate electrode, and wherein the third electrode of the at least one field plate structure is directly in contact with the gate electrode, and wherein the semiconductor region comprises a first side wall and a second side wall, the semiconductor device being a lateral semiconductor device and wherein the first side wall and second side wall:
  extend along a direction going from the first electrode to the second electrode of the lateral semiconductor device to define a non-diverging section and a diverging section extending from said non-diverging section.

23. The semiconductor device according to claim 22, wherein the third electrode of the at least one field plate structure extends along the first side wall and the second side wall and extends to partially fill the at least two recesses to define a depression inside the third electrode and inside the at least two recesses.

* * * * *